United States Patent
Rozynek et al.

(10) Patent No.: US 11,856,709 B2
(45) Date of Patent: Dec. 26, 2023

(54) PROCESS OF FABRICATING A BEADED PATH ON THE SURFACE OF A SUBSTRATE, A SYSTEM FOR FABRICATING SUCH A PATH, USE THEREOF, AND A KIT

(71) Applicant: AGNIESZKA MAGDZIARZ "CADENAS", Poznan (PL)

(72) Inventors: Zbigniew Rozynek, Bydgoszcz (PL); Agnieszka Magdziarz, Pulawy (PL)

(73) Assignee: AGNIESZKA MAGDZIARZ CADENAS, Poznan (PL)

( * ) Notice: Subject to any disclaimer, the term of this patent is extended or adjusted under 35 U.S.C. 154(b) by 330 days.

(21) Appl. No.: 17/262,437

(22) PCT Filed: Aug. 1, 2019

(86) PCT No.: PCT/PL2019/000063
§ 371 (c)(1),
(2) Date: Jan. 22, 2021

(87) PCT Pub. No.: WO2020/027673
PCT Pub. Date: Feb. 6, 2020

(65) Prior Publication Data
US 2021/0235585 A1 Jul. 29, 2021

(30) Foreign Application Priority Data
Aug. 2, 2018 (PL) .......................... 426531

(51) Int. Cl.
*H05K 3/12* (2006.01)
*H01L 31/0224* (2006.01)
*H05K 1/09* (2006.01)

(52) U.S. Cl.
CPC .... *H05K 3/1241* (2013.01); *H01L 31/022425* (2013.01); *H05K 1/092* (2013.01);
(Continued)

(58) Field of Classification Search
CPC ......... H05K 3/1241; H05K 2201/0212; H05K 2203/105
See application file for complete search history.

(56) References Cited

U.S. PATENT DOCUMENTS

| | | |
|---|---|---|
| 2004/0038808 A1 | 2/2004 | Hampden-Smith et al. |
| 2009/0233057 A1* | 9/2009 | Aksay .................. D01D 5/0038 427/469 |
| 2014/0205761 A1 | 7/2014 | Galliker et al. |

FOREIGN PATENT DOCUMENTS

| | | |
|---|---|---|
| EP | 1477230 | 11/2014 |
| WO | WO2007053621 | 5/2007 |

OTHER PUBLICATIONS

PCT Search Report and Written Opinion prepared for PCT/PL2019/000063, completed Nov. 29, 2019.

* cited by examiner

*Primary Examiner* — Austin Murata
(74) *Attorney, Agent, or Firm* — BARNES & THORNBURG LLP

(57) ABSTRACT

The invention relates to a process of fabricating a beaded path on the surface of a substrate, the process comprising: preparing a dispersion of particles in a liquid; supplying the prepared dispersion to at least one electrically conductive microcapillary in a continuous manner; forming and maintaining a convex meniscus of the dispersion at the outlet end of the microcapillary positioned above and/or below the surface of a substrate; applying alternating voltage to the microcapillary so that a beaded structure is formed between the dispersion meniscus and the surface of the substrate; and moving the microcapillary relative to the substrate and/or the substrate relative to the microcapillary so as to deposit the particles of the formed beaded structure on the surface of the substrate and simultaneously rebuild the beaded struc- (Continued)

ture formed between the dispersion meniscus and the surface of a substrate. The invention also relates to a system for realizing this process and the use of the beaded path fabricated in accordance with the process of the invention for the production of electrodes in photovoltaic cells, new generation clothing, electronic components, including flexible electronics, artificial flagella, photonic and optomechanical materials, as well as for the regeneration of damaged paths on the surface of a substrate. The present invention also relates to a kit comprising a substrate and a beaded path fabricated on the surface of that substrate according to this process. The invented process is simple, efficient, hence economical, and enables fabricating beaded paths that retain their properties after turning off the voltage initially used to form a beaded structure. Moreover, the process occurs outside a liquid environment and enables fabricating of paths in a continuous manner, that is, through the formation of the beaded structure and its simultaneous depositing on the surface of a substrate allowing the fabrication of beaded paths of arbitrary length.

20 Claims, 13 Drawing Sheets

(52) U.S. Cl.
CPC ............... *H05K 2201/0212* (2013.01); *H05K 2201/0215* (2013.01); *H05K 2201/0221* (2013.01); *H05K 2203/0126* (2013.01); *H05K 2203/105* (2013.01); *H05K 2203/1131* (2013.01); *H05K 2203/163* (2013.01)

PROCESS OF FABRICATING A BEADED PATH ON THE SURFACE OF A SUBSTRATE, A SYSTEM FOR FABRICATING SUCH A PATH, USE THEREOF, AND A KIT

CROSS-REFERENCE TO RELATED APPLICATIONS

This application is the U.S. national phase of PCT/PL2019/000063, filed on Aug. 1, 2019, which claims the benefit of Polish Patent Application Serial Number P.426531, filed on Aug. 2, 2018, the entire disclosures of both of which are incorporated herein by reference.

TECHNICAL FIELD

The present invention relates to a process of fabricating a beaded path on the surface of a substrate in the form of a line or a non-linear pattern, and the beaded path comprises particles aligned one by one along the path; a system for fabricating such a beaded path, and the applications of the beaded path mainly in electronics, for the production of electronic components, including flexible electronics, for example, as components of new generation clothing; for the production of electrodes in photovoltaic cells, photonic and optomechanical materials, artificial flagella, as well as for the regeneration of damaged paths on the surface of a substrate. The present invention also relates to a kit comprising a substrate and a beaded path fabricated on the surface of that substrate according to this process.

BACKGROUND ART

Substrates covered with thin paths (nano- or micrometre sized) made of nano- or microparticles are used in various branches of industry. The material of the paths, the alignment of the particles forming the path as well as the shape, size and spatial arrangement of the path determine the physico-chemical features of the path, for example, its electrical conductivity, thermal conductivity, elasticity, dispersion of light, ultrasound absorption, biocompatibility, etc. These features determine the functionality of the path and its application. For example, highly electrically conductive thin paths are used for example in photovoltaic industry as electrodes for conducting electric current in photovoltaic cells, while conductive and elastic paths can be harnessed as components of flexible electronics, for example, in new generation clothing.

Thin paths can be formed either from agglomerated particles, whereby their width is greater than the size of a single particle, or from particles aligned one by one along the path, and then the width and height of the path are the size of a single particle. The latter paths resemble beads strung on a thread in appearance, and therefore they are herein referred to as beaded paths (a pearl-necklace structure is a similar term, but a chain-like structure is also widely used). These paths are considered as one-dimensional structures if their anisotropic physico-chemical properties (and not the pattern they form on the surface of a substrate) are taken into account. For example, the periodicity of the structure of the path can be defined only along the path. Such beaded paths can be fabricated in a form of a line or a non-linear pattern, similarly to conductive paths on a printed circuit board.

Besides the above-mentioned applications, beaded paths may be used in electromagnetic energy transport, production of granular conductors and biological or chemical sensors, biomedical labelling, or other applications that rely on anisotropy of a given physical property, for example, in photonic materials. Paths fabricated from colloidal or granular solid particles may be used in the production of light emitting diodes (single-nanowire LEDs), transistors, optomechanical materials, or artificial flagella. In addition, paths fabricated from soft-matter particles, for example, microgel particles, may be used in the production of biological tissues in the subfield of biology rapidly developing in the recent years.

There are various approaches to fabricating micro- and nanopaths on the surface of a substrate from agglomerated particles, and these are in practical use. However, it is more challenging to fabricate beaded paths on the surface of a substrate, hence the literature on their fabrication is more scarce compared to the number of available publications related to the fabrication of paths from agglomerated particles.

As with paths made of agglomerated particles, the beaded paths can be fabricated using lithographic methods or letterpress printing techniques. However, these methods are multi-staged and (in the case of fabricating nano- or micropaths from particles) they are considered expensive: for example preparation of a new form, e.g. a mask or a template, is required each time the change of the arrangement of paths on the surface of a substrate, their position and/or shape is needed. Regarding the screen-print methods, these are not suitable for the formation of structures with a width below several dozen micrometres. Lithographic methods, letterpress and screen printing all belong to the group of techniques that employ the mould (and as already mentioned, such mould needs to be prepared beforehand). Employing any mould-free printing techniques would be therefore advantageous, and in this respect the methods of particle self-organization using electric or magnetic field provide a promising alternative.

Field-assisted methods for the formation of beaded structures are commonly considered more efficient and cheaper than the lithographic methods. This is because they allow fabricating a large number of particle structures at once. However, the field-assisted methods have serious drawbacks which greatly limit their use in fabricating beaded paths on the surface of a substrate. First, self-organization with the use of external electric field (electro-rheological suspensions) or magnetic field (magneto-rheological suspensions) typically takes place in a liquid, the excess of which should be removed, which often implies a serious technical issue (e.g. while drying the liquid with the fabricated paths in it, the paths may break). Second, to maintain a permanent particle structure in the liquid environment continuous energy input is required (e.g. maintaining the electric or magnetic field), unless the particles are specifically treated before their use (e.g. functionalized with proteins or polymer molecules) to maintain the structure they form after the external field inducing self-organization is turned off. Third, the particles can only be nematically aligned along the field lines or the direction of field gradient, and this limits significantly the ability of positioning the paths, and more importantly it is practically impossible to attain the formation of a non-linear pattern, for example an L- or S-shaped path or more complex non-linear architecture on the surface of a substrate.

The following four literature reports (i-iv) present the applications of typical methods of self-organization in the process of fabrication of particle structures, including the beaded paths, that is the structures assembled from particles aligned one by one.

(i) Patent application US2014004275 (A1) and the subsequent publication with number DOI 10.1002/anie.201100290 disclose formation of one-dimensional nanostructures which respond to magnetic field. Those one-dimensional structures are fabricated by inducing bonding between uniform magnetic particles during coating with silica, whereby the applied silica wraps the entire structure up and makes individual magnetic particles connected into a chain. Optical diffraction of the nano-chains can be turned on and off by applying appropriate magnetic field.

It is noted that in the disclosed approach, the one-dimensional structures comprising nanoparticles are formed in a liquid environment, and they can only take a form of a line. In addition, the nanoparticles have to be modified by silica coating (a multi-stage process consisting of PAA coating, sonication, TEOS injection, hydrolysis and condensation) before the formation process. Once the one-dimensional structure is formed the silica needs to be used again to fix the structure.

(ii) B. Bharti et al., "Co-assembly of oppositely charged particles into linear clusters and chains of controllable length" Sci. Rep. 2:1004 (2012) disclose a process of fabricating one-dimensional structures of controllable length composed of oppositely charged solid particles. The fabrication of one-dimensional structures made of latex microparticles in an aqueous environment was presented in the publication. An external alternating voltage was applied to conducting electrodes that resulted in directional bonding of particles into a chain due to the induced dielectrophoretic force. The alternately charged particles with significantly different diameters enabled fabrication of a structure, in which the particle with the larger diameter had opposite charge to that of the particles with the smaller diameter, and the structure remained stable after the external field that fostered particle organization was turned off. In this example, non-conductive particles were used, and those had to be electrically charged.

A limitation of the process disclosed in this publication is that a one-dimensional structure composed of particles is formed in the liquid environment, the structure can only make a line form, and additionally they show a tendency for uncontrollable agglomeration into thicker structures.

Furthermore, in the methods presented in publications (i-ii) there is no possibility of arbitrary positioning of the particle structures or fabrication of non-linear patterns from these structures.

Literature reports are known on the possibilities of forming particle structures outside the liquid environment, that is, pulling the particles out from the dispersion using electric field. However, those methods mainly concern the formation of structures from agglomerated particles, as disclosed in the following two publications.

(iii) J. Tang et al., "Assembly of 1D nanostructures into sub-micrometre diameter fibrils with controlled and variable length by dielectrophoresis" Advanced Materials, 15, 1352 (2003) disclose in their publication a process of fabricating fibril structures/fibres composed of carbon nanotubes. An alternating electric field was used to exert dielectrophoretic force allowing the nanotubes to assemble at the electrode so that they formed an elongated structure from the agglomerated particles between the electrode that moved above the suspension and the electrode placed in that suspension. To form a fibrillar/fibre structure by agglomerating particles, capillary force was used to push the particles towards the forming structure. The capillary force resulted from a liquid capillary bridge formed between the needle-shaped electrode and the surface of the suspension. The thickness of the fabricated structures presented in publication (iii) was not homogeneous along the structure (this feature was used in many subsequent works to fabricate needles for atomic force microscopes or to coat such needles with additional material). The fabricated fibrillar/fibre structures were composed of agglomerated particles. These structures were well resolved in the subsequent publication: (iv) W. H. Yeo et al., "Hybrid Nanofibril Assembly Using an Alternating Current Electric Field and Capillary Action" Journal of Nanoscience and Nanotechnology, 9, 7288 (2009), in which the authors used the same physical phenomena as in publication (iii).

The two above-mentioned publications (iii-iv) disclose the possibility of fabricating particle structures outside the liquid environment. However, the fabricated structures were composed of agglomerated particles. As in publications (i-ii) the possibility of fabricating non-linear patterns from the structures was not presented in publications (iii-iv). Furthermore, according to the disclosure presented in publications (iii-iv), the fabricated structures were very short. Similarly, only short structures can be fabricated using the method disclosed in publication (v), which is the only method that describes the possibility of forming beaded structures outside the liquid environment.

(v) Z. Rozynek et al., "Formation of printable granular and colloidal chains through capillary effects and dielectrophoresis" Nature Communications, 8:15255 (2017), disclose in their publication an electric field-assisted process of drawing beaded structures comprising silver coated glass microparticles from dispersion. Metallic particles dispersed in a non-polar liquid were used to fabricate beaded structures outside a liquid environment. The fabrication of the structures was made in successive steps: dipping a needle in a dispersion, applying an electric field to the immersed needle that resulted in dielectrophoretic attraction of the particles towards the needle, and raising the needle. A beaded structure was formed from the particles as the needle was raised above the dispersion. The beaded structure was stable after the electric field was turned off only if the beaded structure stayed below a certain length. Otherwise the gravitational force acting on a longer structure caused its breaking. Therefore, the presented method can be used only to form short fragments of the beaded structure. Hence, fabricating a longer beaded path on the surface of a substrate would require connecting such short fragments of a beaded structure, which is in practice extremely difficult.

The presented publications address only the subject of particle organization into ordered structures. Yet, particle alignment, formation, or printing on the surface of a substrate in a continuous and efficient manner to fabricate beaded paths with a given shape and arbitrary length have not been addressed. As presented in the state of the art, the fabrication of beaded structures alone, especially outside the liquid environment, is still a challenge. An additional difficulty is their deposition or fabrication on the surface of a substrate in a controlled and continuous manner to fabricate paths, in particular in a specific location in the space, additionally of a given shape, in particular paths of any non-linear patterns, and additionally of an arbitrary length, especially in a fast and efficient manner.

The use of a capillary as a component of a system for pattern formation is known, in which the pattern is formed by moving the capillary relative to a substrate, and the material for pattern formation comes out from that capillary. Three examples of literature references are presented below, which address the use of a movable capillary for the fabrication of patterns (e.g. a matrix of dots) or paths made of particles or molecules on the surface of a substrate.

(vi) L. Friedrich and M. Begley, "In situ characterization of low-viscosity direct ink writing: stability, wetting, and rotational flows" Journal of Colloid and Interface Science (2018), doi: 10.1016/j.jcis.2018.05.110, disclose optimization of a setup comprising a stationary microcapillary and a movable substrate, both used for printing lines on the surface of a substrate (of glass or hardened ink). They studied the influence of the composition of the ink, distance between the capillary and the surface of the substrate, and coverage of the surface of the substrate on the printing process.

(vii) A. Bruckbauer et al., "Writing with DNA and Protein Using a Nanopipet for Controlled Delivery" Journal of the American Chemical Society, 124, 8810 (2002), disclose in their publication a process of "printing" patterns made of biopolymers or protein using a nanopipette which moves over the surface of a substrate. Applying voltage to the nanopipette resulted in the release of molecules of biopolymers or proteins from the nanopipette. The mechanism of releasing particles from the pipette towards the surface of a substrate is complex and based on three physical mechanisms, i.e., electroosmosis, electrophoresis, and dielectrophoresis, and the strength of each force depends on the size, charge and polarizability of the molecules. The whole process occurs in a liquid environment and results in the fabrication of a matrix of dots from molecules on the surface of a substrate immersed in the liquid.

(viii) H. J. Zhang et al., "Electrochemical microprocess by scanning ion-conductance microscopy" Journal of Vacuum Science & Technology B, 17, 269 (1999), disclose in their publication a process of fabricating dots or lines made of copper nanoparticles using scanning ion-conductance microscopy, similarly as in publication (vii). The substrate on which the particles were deposited was electrically conductive and covered with an electrolytic liquid in which the whole process took place. A pipette used in scanning ion-conductance microscopy with an outlet size of about 150 nm was used as a nanopipette, similarly as in publication (vii). Such a nanopipette is very fragile and easy to damage, and also relatively expensive and not easy to replace. The process and the setup presented in publication (viii) allow fabricating structures with a narrow range of width, and require the surface of a substrate to be extremely smooth.

Neither the process nor the system for fabricating beaded paths from particles aligned on the surface of a substrate in a form of a line or a more complex non-linear pattern have been disclosed in the listed publications (vi-viii).

Summary: The majority of the research reports on the possibilities of fabricating paths from agglomerated particles, but the fabrication of beaded paths still remains a challenge. Though, in general, the formation of beaded structures is possible, their formation or alignment on the surface of a substrate in a form of beaded paths, in particular non-linear, with arbitrary length, and in particular outside the liquid environment, in an economic, continuous and efficient manner has not been presented until now.

A Problem to be Solved by the Invention

A process of fabricating a beaded path/beaded paths on the surface of a substrate in a form of a line or a non-linear pattern, and an uncomplicated, efficient, and thus relatively low-cost system for realizing this process that will enable the fabrication of the beaded paths, which will retain their properties without a need for continuous energy input, i.e. after turning off the voltage initially used to form a beaded structure, are the technical problems the claimed invention addresses. In particular, there is a demand for a process of fabricating beaded paths outside the liquid environment and in a continuous manner through the formation of the beaded structure and its simultaneous depositing (printing) on the surface of a substrate enabling the fabrication of beaded paths of arbitrary length.

These technical problems are solved by the present invention.

SUMMARY OF THE INVENTION

The present invention relates to a process of fabricating a beaded path on the surface of a substrate, the process comprising:
  a) preparing a dispersion of particles in a liquid;
  b) supplying the prepared dispersion to at least one electrically conductive microcapillary in a continuous manner;
  c) forming and maintaining a convex meniscus of the dispersion at the outlet end of the microcapillary positioned above and/or below the surface of a substrate;
  d) applying alternating voltage to the microcapillary so that a beaded structure is formed between the dispersion meniscus and the surface of the substrate; and
  e) moving the microcapillary relative to the substrate and/or the substrate relative to the microcapillary so as to deposit the particles of the formed beaded structure on the surface of the substrate and simultaneously rebuild the beaded structure formed between the dispersion meniscus and the surface of a substrate, so that a beaded path is fabricated on the surface of that substrate.

Preferably, particles of solid matter or soft matter are used, in particular granular or colloidal particles.

Preferably, particles with a size of 20 nm to 1 mm are used.

More preferably, granular particles are used, in particular with a size of from approximately 1 µm to approximately 1 mm.

More preferably, colloidal particles are used, in particular with a size of from approximately 20 nm to approximately 1 µm.

Preferably, particles made of an electrically conductive material and/or a material with a high dielectric constant or core-shell particles, where the core is electrically non-conductive and the shell is made of an electrically conductive material, are used.

More preferably, particles made of material with a density of from 0.1 g/cm$^3$ to 10 g/cm$^3$ are used.

More preferably, steel particles are used, in particular, with a size of from 25 µm to 300 µm.

More preferably, glass particles coated with a layer of silver are used, in particular, with a size of from 15 µm to 100 µm.

More preferably, modified polystyrene particles are used, in particular, with the size of 40 µm.

More preferably, copper particles are used, in particular, with a size of from 1 µm to 25 µm.

More preferably, spherical particles are used.

More preferably, oval particles are used.

More preferably, cylindrical particles are used.

Preferably, at least two types of particles of different average sizes and/or made of different materials are used.

Preferably, functionalized particles are used, in particular with the surface modified using proteins or polymer molecules.

Preferably, particles dispersed in an electrically weakly-conductive liquid of low dielectric constant or in a mixture of such liquids are used, in particular in a non-polar liquid.

Preferably, the viscosity of the liquid is from 10 mPa·s to 10000 mPa·s.

Preferably, the particles are dispersed in a liquid selected from the group comprising natural oil, synthetic oil, paraffin and resin.

More preferably, castor oil is used as the natural oil.

More preferably, silicone oil is used as the synthetic oil.

More preferably, epoxy resin is used as the resin, in particular mixed with a volatile organosilicon compound, more specifically with cyclopentasiloxane.

More preferably, at least one substance selected from the group of surfactants, polar substances and inorganic salts or their mixtures is added to the liquid, more specifically tetra-n-butylammonium bromide or dioctyl sodium sulfosuccinate.

Preferably, particles having a density higher than the density of the liquid dispersion are used, when the microcapillary is moved above the surface of the substrate.

Preferably, particles having a density lower than the density of the liquid dispersion are used, when the microcapillary is moved below the surface of the substrate.

Preferably, the concentration of particles in the dispersion is in the range of 10% to 50% by volume.

Preferably, the distance between the dispersion meniscus and the surface of the substrate is at least three times the size of a single particle, and not less than 50 µm.

More preferably, the distance between the dispersion meniscus and the surface of the substrate is no more than fifty times the size of a single particle.

Preferably, alternating voltage is applied with the magnitude so that the dielectrophoretic force acting on the particle overcomes the capillary force resulting from the capillary bridge formed between the surface of the dispersion liquid and the particle being pulled out from this dispersion.

More preferably, the minimum magnitude of the voltage applied to the microcapillary is 300 V, and the minimum frequency is 100 Hz.

More preferably, the magnitude of the voltage is in the range of 500 V to 3 kV, and the frequency is from 100 Hz to 10 MHz.

Even more preferably, the voltage is 500 V, and the frequency is 1000 Hz.

Even more preferably, the voltage is 750 V, and the frequency is 5000 Hz.

Even more preferably, the voltage is 1000 V, and the frequency is 100 Hz.

Preferably, the voltage used to initiate the formation of a beaded structure is approximately twice as high as the magnitude of the voltage used during the deposition of the particles of the formed beaded structure on the surface of a substrate.

Preferably, the microcapillary is moved relative to the substrate and/or the substrate is moved relative to the microcapillary using an xyz translation stage.

Preferably, the microcapillary is moved relative to the substrate and/or the substrate is moved relative to the microcapillary in one direction.

More preferably, the microcapillary is moved relative to the substrate and/or the substrate is moved relative to the microcapillary in at least two directions.

Even more preferably, the microcapillary is moved relative to the substrate and/or the substrate is moved relative to the microcapillary in at least two directions with a step not larger than the order of magnitude of a single particle.

Even more preferably, the microcapillary is moved relative to the substrate and/or the substrate is moved relative to the microcapillary at a speed of 0.1 µm/s to 10 cm/s, in particular at a speed of 10 µm/s to 1 cm/s.

Preferably, a microcapillary made of an electrically conductive material that does not chemically react with the dispersion or the particles is used.

More preferably, a microcapillary made of metal or metal alloy, in particular gold, silver, copper or stainless steel, is used.

Preferably, two or more microcapillaries that are moving in a non-collisional manner in the same or different directions are used.

More preferably, all microcapillaries are moved using one translation stage, or each microcapillary or a group of microcapillaries is moved using a separate translation stage.

More preferably, the distance between the microcapillaries is at least twice the distance between the dispersion meniscus and the surface of the substrate.

Preferably, the dispersion is supplied to the microcapillary using a dosing unit, in particular a syringe pump.

Preferably, the same dispersion is supplied to each microcapillary.

Preferably, different dispersions are supplied to each microcapillary.

Preferably, when three or more microcapillaries are used, the same dispersion is supplied to at least two of them and different dispersions are supplied to the other microcapillaries.

Preferably, a material with electrical conductivity below $10^3$ S·m$^{-1}$ is used as the substrate.

Preferably, a material with electrical conductivity above $10^3$ S·m$^{-1}$ coated with a layer of a material with electrical conductivity below $10^3$ S·m$^{-1}$ is used as the substrate.

More preferably, a crystalline or amorphous material, in particular a rigid or flexible material, is used as the substrate.

Even more preferably, glass, polymer or semiconductor materials are used.

Even more preferably, materials absorbing liquid are used, in particular having pores and/or cracks and/or fibres with a size of at least an order of magnitude smaller than the size of the particle forming the beaded path.

More preferably, fabrics or paper are used.

More preferably, a substrate with a flat surface and/or wavy and/or curved and/or with steps and/or cracks is used.

Preferably, the beaded structure is deposited on the surface of the substrate partially or completely covered with a liquid immiscible with the dispersion liquid.

Preferably, a beaded path in a form of a line or non-linear pattern is fabricated.

Preferably, once the beaded path is fabricated on the surface of a substrate, the alternating voltage is turned off, the microcapillary is moved to another position above and/or below the surface of the substrate and the stages d) and e) of the process are repeated to fabricate another beaded path on the surface of the substrate.

More preferably, the paths are fabricated so that they either cross or connect with the previously fabricated beaded path on the surface of a substrate.

Preferably, the fabricated beaded path is subjected to a sintering process, in particular using a microwave device or a hot plate.

Preferably, the meniscus at stage c) of the process is made and maintained by means of a setup for controlling the amount of the dispersion supplied from the dosing unit to the microcapillary, in particular an optical system, more specifically a digital microscope connected to a computer.

Preferably, a voltage generator, in particular with a feature of adjusting the electric current, or a voltage generator with an external current limiter, is used as a source of the alternating voltage.

The invention also relates to a system for fabricating a beaded path on the surface of a substrate (9) comprising
- at least one container for a dispersion of particles in a liquid, whereby the container is placed in a dispersion dosing unit (2), wherein at least one electrically conductive microcapillary (1) has fluid connection to each container for a dispersion of particles in a liquid through a microfluidic unit (3), and
- a setup for controlling the amount of the dispersion that includes an optical system (5) connected to a computer (6), and this setup is connected to the dispersion dosing unit (2), and
- at least one source of high voltage (7), wherein each source of high voltage (7) is connected by an electrical wire (4) to at least one electrically conductive microcapillary (1), wherein each at least one electrically conductive microcapillary (1) coupled to one container is connected to only one and the same source of high voltage (7), and
- at least one translation stage, to which at least one electrically conductive microcapillary (1) or substrate (9) is attached.

Preferably, the system comprises a syringe as the container for a dispersion.

Preferably, the system comprises a syringe pump as the dispersion dosing unit (2).

Preferably, the system comprises a microfluidic polymer tube as a part of the microfluidic unit.

Preferably, the system comprises a digital microscope as an optical system.

Preferably, the inner diameter of the microcapillary is at least five times as large as the size of a single particle.

Preferably, the system comprises a translation stage enabling translation at a maximum speed of at least 10 cm/s.

The present invention also relates to a use of the beaded path, fabricated according to the process as defined above, for fabrication of electronic components.

The present invention also relates to a use of the beaded path, fabricated according to the process as defined above, for fabrication of flexible electronic components.

The present invention also relates to a use of the beaded path, fabricated according to the process as defined above, for fabrication of electrodes in photovoltaic cells.

The present invention also relates to a use of the beaded path, fabricated according to the process as defined above, for fabrication of clothing.

The present invention also relates to a use of the beaded path, fabricated according to the process as defined above, for regeneration of damaged paths on the surface of a substrate.

The present invention also relates to a use of the beaded path, fabricated according to the process as defined above, for fabrication of artificial flagella.

The present invention also relates to a use of the beaded path, fabricated according to the process as defined above, for fabrication of photonic materials.

The present invention also relates to a use of the beaded path, fabricated according to the process as defined above, for fabrication of optomechanical materials.

The present invention also relates to a kit comprising the substrate and the beaded path fabricated on the surface of the substrate according to the process as defined above.

DETAILED DESCRIPTION OF THE INVENTION

Definitions

The scientific and technical terms in this document have the usual meanings used in the field of the invention. The definitions below are provided to the reader to facilitate the implementation of the invention.

The term "particle"/"particles" refers to objects of solid matter or soft matter, such as nanoparticles and microparticles, including colloidal particles and granular particles made of either one or many materials (core-shell particles or Janus particles), membranes, capsules, stabilized emulsion droplets, or gel particles. These particles may have a regular shape, such as oval, cylindrical or spherical, preferably spherical.

The term "beaded structure" refers to a one-dimensional structure of particles made between a dispersion meniscus formed at the outlet end of a microcapillary and the surface of a substrate, as a result of supplying voltage to that microcapillary. The particles are aligned one by one along the structure, and capillary bridges of the dispersion liquid (their role is described below in the document) are located between the particles. The beaded structure is flexible, which enables its deposition on the surface of a substrate for fabricating a beaded path.

The term "beaded path" refers to a one-dimensional structure of particles fabricated on the surface of a substrate through deposition of particles of the formed beaded structure on that surface. The beaded path is made of particles aligned one by one along the path, and it may take a form of a line or a non-linear pattern.

Liquid

A weakly-conductive liquid (or a liquid mixture) with a low value of the dielectric constant in the range of 1 to 100, preferably in the range of 1.5 to 10, and electrical conductivity in the range of $10^{-12}$ S/m to $10^{-4}$ S/m, preferably in the range of $10^{-12}$ S/m to $10^{-6}$ S/m, is used for preparing a dispersion. These listed ranges of the physical quantities result from the fact that the dielectrophoretic force acting on a particle to be moved from the convex meniscus of the dispersion to the surface of a substrate depends on the difference of dielectric constants and the electrical conductivity difference between the particles and the liquid, that is, the greater the difference in magnitudes of these physical properties between the particles and the liquid, the greater the dielectrophoretic force acting on the particle. Furthermore, the suggested range of electrical conductivity enables elimination or at least reduction of the influence of unfavourable electrical interactions which would affect the process of fabricating beaded paths on the surface of a substrate. These unwanted phenomena include, for example, electrophoretic particle motion owing to the accumulated contact charge (contact charge electrophoresis) or the phenomenon of electrohydrodynamic liquid flow. Besides using a liquid with a low magnitude of electrical conductivity and a low value of the dielectric constant, it is suggested to use alternating voltage with frequency above 100 Hz, which, in turn, additionally prevents the above-mentioned unfavourable electrical phenomena. Preferably, a non-polar liquid is used with the properties of electrical conductivity and dielectric constant as described above. Thus, a natural oil (for example, castor oil), a synthetic oil (for example, silicone oil), a mixture of a resin and a volatile compound, or paraffin, can be used for preparing the dispersion, as demonstrated in Examples 1-17, and 19. There is no upper value of the viscosity of a liquid that would prevent implementation of the process of fabricating a beaded path, though the efficiency of the process is reduced when a liquid with high viscosity is used. Therefore, it is recommended to use a liquid with lower viscosity wherever possible. However, the unwanted action of electrohydrodynamic forces with their magnitudes being inversely proportional to the viscosity of a liquid may occur if a liquid with viscosity below 10 mPa·s is used. Therefore, it is recommended to use a liquid with viscosity in the range of 10 mPa·s to 10000 mPa·s. For preparing a particle dispersion a liquid can be used which after some time hardens or crystallizes, for example, an epoxy resin mixed with a volatile organosilicon compound, such as cyclopentasiloxane, which hardens typically a few minutes after the deposition of particles of the beaded structure on the surface of a substrate; or for example, heated paraffin that changes its state from liquid to solid during cooling, as demonstrated in Example 12. In the preferred embodiment, at least one substance selected from the group of surfactants, polar substances and inorganic salts such as, for example, tetra-n-butylammonium bromide (TBAB) or dioctyl sodium sulfosuccinate (AOT), may be added to the suspension liquid. Adding a surfactant to the liquid modifies the surface tension of the dispersion and this may contribute to the better adhesion of the liquid of capillary bridges to the surface of a substrate. Adding polar substances to the liquid increases the adhesion of particles to the surface of a substrate. In addition, adding an inorganic salt to the liquid increases the number of ions in the dispersion liquid, which in turn weakens electrostatic interactions between the particles of a beaded path. These interactions may lead to the formation of dendritic branches at high values of voltage, that is, above 1500 V. The dispersion is placed in a container, for example, a syringe, from which it is conveyed directly or through a tube to a microcapillary using, for example, a syringe pump. If particles with a size larger than several microns and density considerably different from the density of a liquid are used, such particles may quickly sediment or float in the container, and this may cause clogging of the tube. In such case, it is advised to use a container which enables continuous stirring of the liquid, for example, using a magnetic stirrer, ultrasound or other commonly known liquid stirring method, for preventing particle sedimentation or floating in that container.

Particles

In the process of the invention, particles, as defined above, with a size ranging from approximately several tens of nanometres to approximately several hundred micrometres are used. Generally, particles with a size of from approximately 20 nm to approximately 1 mm are used, for example, colloidal particles with a size from approximately 20 nm to approximately 1 μm, or granular particles with a size from approximately 1 μm to approximately 1 mm. In different embodiments, particles with a size in the range from approximately 1 μm to approximately 300 μm, from approximately 25 μm to approximately 300 μm, from approximately 1 μm to approximately 200 μm, from approximately 25 μm to approximately 200 μm, from approximately 15 μm to approximately 100 μm, and from approximately 1 μm to approximately 25 μm are used as examples.

The voltage (discussed in further detail below), provided to the microcapillary with the prepared particle dispersion inside, results in particle displacement and arrangement due to the dielectrophoretic interaction. To pull a particle out from the dispersion meniscus and to eventually deposit it on the surface of a substrate, the dielectrophoretic force acting on the particle has to be greater than the capillary forces which keep it on the surface of the dispersion. The magnitude of this force depends on the applied voltage as well as on the difference between dielectric constant values and electrical conductivity values of the particles and the liquid. Therefore, to ensure the strongest dielectrophoretic force, the particles and the dispersion liquid should be selected so that the difference between the values of these quantities is the largest possible. The value of the dielectric constant of the particles should be at least twice that of the dielectric constant of the dispersion liquid, whereas the value of the electrical conductivity of the particles should be at least one order of magnitude larger than that of the dispersion liquid. In conjunction with the materials of liquids described in the previous paragraph, particles with a high dielectric constant, that is, above 10, preferably above 20, more preferably above 30, and with the value of electrical conductivity above $10^{-10}$ S/m, in particular in the range of $10^{-6}$ S/m to $10^8$ S/m, are used for preparing the dispersion. Various materials are known that meet this condition, and among them the following particles can be listed as examples: (i) solid particles, for example, gold, silver, copper, stainless steel, aluminium; (ii) core-shell particles, where the core is electrically non-conductive and the shell is made of an electrically conductive material, for example polymer molecules coated with a layer of gold; (iii) particles consisting of many phases, for example, glass microspheres, with air inside the microsphere and a silver layer on its surface; (iv) micron-sized capsules or membranes with shells made of materials with the physical parameters mentioned above; (v) nano- or micrometre-sized gel particles; and (vi) stabilized emulsion droplets. In a different embodiment of the presented process, particles with the electrical properties that can be modified during the fabrication of beaded paths can also be used. Such particles include certain particles made of semiconducting materials, and these may become good conductors being illuminated by light with specific intensity and a wavelength range. If the dispersion liquid of the meniscus formed at the outlet end of a microcapillary is optically transparent to light with energy greater than the semiconductor band gap of the particle material, the value of electrical conductivity of such particles may significantly increase thus facilitating their dielectrophoretic self-organization, and thus enable their use in the process of formation of beaded paths on the surface of a substrate. Particle concentration in the liquid should be in the range of 10 to 50 percent by volume, and more preferably in the range of 30 to 50 percent by volume. Particle density has essentially no effect on the physics of the formation of a beaded structure, but it only affects the orientation of the microcapillary relative to the substrate, as described below in the paragraph about the arrangement of the microcapillary-substrate system. The use of particles with density in the range of 0.1 g/cm³ to 10 g/cm³ is recommended. In accordance with the invention, functionalization of particles is not required for the fabrication of stable beaded paths. However, the process does not exclude such a possibility, as long as the functionalized particles preserve the appropriate electrical properties. Functionalization of particles may rely for example on modification of their surface with proteins or polymer molecules, which may be used for rigidifying the beaded path after its fabrication.

Microcapillary

The microcapillary should be made of an electrically conductive material (for example metals or metal alloys, such as gold, silver, copper and stainless steel). It is recommended to choose a material that does not chemically react with the dispersion or the particles. A stainless-steel syringe needle with its sharp end ground may be used as the microcapillary, as this was the approach in the experiments with the results presented in Examples 1-17 and 19.

The commonly available syringe needles have outer diameters typically in the range of 0.15 mm to 3 mm and inner diameter in the range of 0.05 mm to 2.7 mm. As the microcapillary, commonly available and also inexpensive stainless-steel microtubes can be used with the smallest outer diameter of the order of 100 µm and the smallest inner diameter of the order of 20 µm. The inner diameter of the microcapillary should be at least five times as large as the diameter of a single particle to prevent its clogging by particles flowing through it, and at the same time it is recommended not to be more than 30 times the size of a single particle. In general, a smaller inner diameter of the microcapillary ensures higher precision of particle deposition on the surface of a substrate. The length of the microcapillary should be as small as possible, but it still should enable its connection to the electrical wire for providing voltage. An approx. 1 cm long microcapillary was used in Examples 1-17 and 19. The electrical wire was soldered to the upper part of the microcapillary, though the way of connecting the electrical wire is non-essential and may be different; for example, the wire can be glued using a conductive adhesive or mechanically mounted using so-called crocodile clips. It is important that the microcapillary is electrically conductive, as it was the case of the syringe needle used in the attached Examples. The microcapillary or the substrate is mounted on an arm of the xyz-axis translation stage. In the presented Examples of the embodiment of the process of fabricating beaded paths, except Examples 2, 10 and 13, a movable microcapillary was used. A translation stage allowing movement of the microcapillary (or the substrate) with a maximum speed of at least 10 cm/s, preferably in the range of 0.1 µm/s to 10 cm/s, more preferably 10 µm/s to 1 cm/s, is usually used. Preferably, the translation stage has a step no greater than the order of magnitude of particle size. In the conducted experiments presented in the Examples, the translation stage with a step of 2 µm in all directions and allowing translation with a maximum speed of 3 cm/s was used (NRT100, Thorlabs). After supplying the dispersion to one end of the microcapillary, a convex dispersion meniscus is formed at the other (i.e., outlet) end of this microcapillary. The shortest distance of the convex meniscus from the surface of a substrate should be at least three times the size of a single particle, but not less than 50 µm and at most fifty-fold the size of a single particle. For example, this value is 500 µm for spherical particles with the size of 50 µm. As the distance increases so does the possibility of breaking the beaded structure formed between the convex meniscus at the outlet end of the microcapillary and the surface of the substrate. By contrast, too short distance may cause capillary attraction of the dispersion droplet located at the end of the microcapillary towards the surface of a substrate and spilling of that droplet over the surface.

In accordance with the invention, the process enables the simultaneous use of multiple microcapillaries comprising the electrodes moving accordingly above the surface of a substrate (an example of two independent microcapillary movements in different directions is shown in FIG. 15 (a), in which the directions of microcapillary movement (M1 i M2) are indicated by the arrows). All microcapillaries can be mounted to one translation stage or each of them individually, or groups of microcapillaries can be mounted to separate translation stages. In the latter solution, the substrate should be stationary. It should also be ensured that the electrodes move in a non-collisional way and are at a distance at least two times as great as the distance between the dispersion meniscus and the surface of a substrate. A voltage signal should be supplied separately to each of the microcapillaries. Generally, the use of several or more microcapillaries separately is possible, but technologically difficult to implement.

When parallel beaded paths are fabricated it is recommended to use microcapillaries mounted on one translation stage and electrically connected to each other. In this way only one source of voltage is used and controlled, and the number of translation stages is reduced. In such a case, both the substrate and the microcapillaries can be moved to fabricate paths that will be parallel to each other (parallel paths are commonly used, for example, to fabricate conductive electrodes for photovoltaics or electronics). The distance between such microcapillaries placed on one translating stage should be at least twice the distance between the dispersion meniscus and the surface of a substrate to prevent contact between the dispersion menisci. However, this does not mean that the distance between the fabricated adjacent and parallel beaded paths will be determined by the distance between microcapillaries. For example, when the microcapillaries are positioned side by side, resembling teeth of a comb by appearance, the distance between adjacent and parallel beaded paths fabricated on the surface of a substrate using such a "comb" of microcapillaries can be controlled by adequate positioning of the "comb" axis relative to the direction of translation. For example, if the translation direction of the "comb" of microcapillaries is perpendicular to the axis along which the microcapillaries are placed, the distance between the beaded paths will be the same as the distance between the microcapillaries. However, if the angle between the translation direction and the "comb" axis is 30°, the distance (L) between the adjacent paths will be half of the distance (2L) between the electrodes, as illustrated in FIG. 15 (b). In another embodiment of the process different types of dispersions may be supplied to individual microcapillaries or to the group of microcapillaries, and this allows fabricating paths from different particles (types and/or sizes) simultaneously.

Substrate

The substrate can be made of one type of material or may have layered structure, including multi-layer structure. Yet, the physical properties of the substrate on which a beaded path is fabricated are important. It is recommended to use non-electrically conductive surfaces, or with a low value of electrical conductivity, i.e., below $10^3$ S·m$^{-1}$, more preferably below $10^{-3}$ S·m$^{-1}$. Such materials include most synthetic polymers, most glass varieties, most semiconducting materials, etc. The optical properties of the substrate and/or its surface are not important, and the selection of the substrate on which a beaded path will be fabricated is determined by its ultimate application. The substrate can be of a crystalline, amorphous, rigid or flexible material. Beaded paths made of micrometric particles can also be formed on the surfaces of the substrates which can absorb liquid, and this is a great advantage of this process compared to the methods of the art. However, it is recommended that the pore size of the liquid absorbing material is at least one order of magnitude smaller than the size of the particle forming the beaded path on the surface of this material. However, fabricating a beaded path on a porous surface (or with cracks) with pore size larger than the size of the particles is also possible, as illustrated in FIG. 6 (e). When using a substrate with the surface consisting of protruding fibres, the size of such fibres should be one order of magnitude smaller than the size of the particle forming the beaded path.

Thus, in accordance with the process of the invention, it is possible to use a substrate of a non-conductive or weakly-conductive material. It is also possible to use as the substrate a conductive material, i.e. with electrical conductivity above $10^3$ S·m$^{-1}$, only if is coated with a layer of a material with electrical conductivity below $10^3$ S·m$^{-1}$.

In the embodiments of the invention, processes of fabricating beaded paths on a glass surface of microscope glass slides (soda-lime glass and borosilicate glass), PVC foil (polyvinyl chloride), cellulosic paper, cotton fabric and on a semiconducting silicon substrate are presented. The process of the invention also enables fabricating beaded paths on a substrate having a flat, wavy, or curved surface, as well as on a surface with steps or cracks, as presented on images in FIG. 6 (a-f).

In accordance with the process of the invention, it is also possible to fabricate beaded paths on the surface of a substrate which is immersed in a liquid immiscible with the dispersion liquid (FIG. 16 (a)) or when there is a liquid path on this surface along which the process of formation of a beaded path will be carried out (FIG. 16 (b)), as demonstrated on images in FIG. 16 (c-d).

Microcapillary-Substrate System

In the process described herein, the density of the particles to be used for fabricating a beaded path is initially determined. If particles with density greater than that of the liquid used for preparing the dispersion are used, the microcapillary to which the dispersion will be supplied is placed above the surface of a substrate on which a beaded structure is to be deposited to form a beaded path. Whereas in the case where particles with density lower than that of the liquid used for preparing the dispersion are used, the system needs to be inverted by 180 degrees, i.e. the surface of a substrate is above the microcapillary whose outlet end is in this case in the upward direction, meaning that the beaded structure is formed in the opposite direction to gravity, and the particles that are initially in the dispersion forming a convex meniscus at the outlet end of the microcapillary will be transported up towards the surface of the substrate. Proper selection of the geometry of the system is particularly important for particles larger than a few micrometers, because gravity and buoyancy forces acting on such particles cause their sedimentation or floating.

Optical System in a Feedback Loop

For dosing an appropriate amount of dispersion, that is, to avoid the excess dispersion flowing out of the microcapillary that could, for example, drip on the surface of a substrate, and to ensure that the dispersion does not run short for the embodiment of the process it is recommended to use an optical system, for example, a digital microscope connected to a computer with software for analysing the amount of the dispersion (i.e., the shape of the dispersion meniscus) and controlling the operation of the dosing unit, for example, a syringe pump. In the embodiment of the present invention, any optical system can be used such as the optical system in which a digital microscope, for example, Dino-lite AM7315, continuously provides an enlarged image of the area with a microcapillary to a computer. Such an image is then analyzed through computer software, for example, commercially available computer software (MATLAB, Image Processing Toolbox), which recognizes the shape and size of the dispersion meniscus formed at the outlet end of a microcapillary, and then based on the results of image analysis it sends information to the unit for dosing the dispersion. Dosing of a dispersion is realized using a precise unit for dispersion dosing, for example, a syringe pump (neMESYS from CETONI). If a set of many microcapillaries is used, the dispersion can be supplied from one container or many containers with different dispersions, and the method for supplying and controlling the dispersion can be similar to the presented process scheme described above.

Voltage

After preparing the dispersion, conveying to the microcapillary, forming the convex meniscus at the outlet end of the microcapillary, and placing the microcapillary at the desired distance and position relative to the surface of a substrate, the next step is to provide voltage to that microcapillary. The method of supplying electric signal from the source was defined above in the section describing the microcapillary. Any voltage amplifier can be used as the source of alternating voltage, for example, Ultravolt HVA, model 5HVA24-BP1. The electrical signal used should have amplitude with such magnitude that the dielectrophoretic force acting on a particle ($F_{diel}$) overcomes the capillary force ($F_{cap}$) resulting from the so-called the capillary bridge formed between the surface of the dispersion liquid and the particle pulled from it, that is, the dielectrophoretic force should be stronger than the capillary force to pull the particle out from the surface of the liquid.

The order of magnitude of the dielectrophoretic force can be calculated using the conventional dielectrophoretic model, where the dielectrophoretic force is expressed by the equation:

$$F_{diel} \approx \varepsilon_{liquid}\varepsilon_o R^3 \kappa \nabla(E^2),$$

where R is the radius of a spherical particle, κ is the Clausius-Mossotti factor, E is the electric field, and $\varepsilon_{liquid}$, $\varepsilon_o$ are the dielectric constants of the liquid and the vacuum, respectively.

The order of magnitude of the capillary force can be calculated using the following equation:

$$F_{cap} \approx \gamma R,$$

where γ is the surface tension.

In the case of spherical particles of silver, gold, copper, stainless-steel particles, or particles made of glass microspheres coated with silver, with the size in the order of several tens of m, dispersed in silicone oil, castor oil, liquid paraffin, or resin with an optionally added volatile compound (materials used in the conducted experiments with the results presented in the attached Examples of embodiments of the invention), the magnitude of voltage provided to the microcapillary should be above 300 V. In the presented Examples of the embodiment of the process of fabricating beaded paths voltage of 500 V and frequency of 1 kHz was used, except Example 5 where voltage of 750 V and frequency of 5 kHz was used, and except Example 9 and Example 15 where voltage of 1000 V and frequency of 100 Hz was used. The alternating voltage is used to eliminate unwanted electrohydrodynamic and electrostatic phenomena, which otherwise could have emerged at lower frequencies of the alternating voltage or at constant voltage affecting the process of path fabrication. It is recommended to use alternating voltage with an arbitrary shape but symmetrical (for example, a square-wave, a sine-wave or a triangle-wave signal) with frequency of 100 Hz to 10 MHz and a mean value of voltage between 500 V and 3000 V (for the particle materials and sizes mentioned above in the description of particles), in particular with such a magnitude that enables generation of dielectrophoretic force larger than the force of the capillary interaction of particles at the surface of the dispersion liquid. The voltage applied to the microcapillary on which the particle dispersion is formed induces non-uniform electric field between the dispersion meniscus formed at the end of that microcapillary and the substrate. This non-uniform electric field triggers motion and arrangement of particles due to the dielectrophoresis phenomenon. At the respectively high voltage provided to the capillary, the dielectrophoretic force $F_{diel}$ acting on a single particle overcomes the force of capillary interaction $F_{cap}$ between the particle and the surface of the dispersion liquid leading to the formation of a beaded structure, that is, a one-dimensional structure of particles aligned one by one and formed between the dispersion meniscus and the surface of a substrate. FIG. 1 (a-c) presents schematically the formation of such beaded structure and its position, where at time to (FIG. 1(a)) the microcapillary with the particle dispersion meniscus is placed above the surface of the substrate, whereas at time $t_1$ (FIG. 1 (b)) the voltage is applied to the microcapillary resulting in an immediate (in the order of milliseconds) formation of the beaded structure formed from the dispersion meniscus towards the substrate. At this stage, the particles deform the dispersion meniscus first, as presented in FIG. 1 (b), and then following the first particle other particles are pulled and leave the dispersion meniscus forming in such process a structure that resembles a bead necklace of particles in appearance (a beaded structure). The mentioned beaded structure reaches the surface of the substrate and is oriented roughly perpendicular to that surface (FIG. 1 (c)). In the preferred embodiment of the invention, for initiation and/or accelerating the initiation of the formation of a beaded structure voltage with magnitude around two times as large as the magnitude of the voltage used during the deposition of particles of the formed beaded structure on the surface of a substrate can be used (for example, the elevated voltage for the formation of the beaded structure is 1000 V, whereas the fabrication of the beaded path is carried out at 500 V). It may turn out that it is preferable to use offset voltage (DC offset) with magnitude in the range of 0 to approximately 100 V for the formation of the beaded structure and its deposition on the surface of a substrate; for example, a square-wave signal is +600 V and −500 V, respectively (or +500 V and −600 V), instead of +500 V and −500 V. Subsequently, the capillary is moved relative to the substrate or the substrate relative to the microcapillary to initiate the deposition of particles of the beaded structure on the surface of the substrate. The selection of the mode of moving the elements of the system relative to each other is determined only by practical considerations and does not change the essence of the physical phenomena. The movement of the elements (microcapillary, substrate) relative to one another results in the sequential deposition of the particles of the formed beaded structure nearest to the surface, and the simultaneous pulling of other particles (sequentially) out of the dispersion, and thus, rebuilding the beaded structure at the side of the dispersion meniscus, and hence enabling the continuity of the process of fabrication of a beaded path. FIG. 1 (d-e) presents the subsequent steps of depositing a beaded structure on the surface of a substrate forming a beaded path, where the translation of the microcapillary above the surface of the substrate is indicated by the arrow.

Appropriate movement of the microcapillary along and across (along the x and y axes) relative to the substrate (or the substrate relative to the microcapillary) enables fabricating a beaded path in a nonlinear pattern. The fabrication of the nonlinear beaded path forming the shape of letter 'C', a sine wave, and a square wave, respectively, is presented in Example 5.

Voltage was supplied continuously during the process of fabricating a beaded path on the surface of a substrate.

In the preferred embodiment of the process according to the invention, after the fabrication of the beaded path according to the desired pattern, the voltage can be turned off, and the microcapillary can be moved to another position to initiate the fabrication of another beaded path after the voltage is turned on again and the beaded structure is formed. Besides the fabrication of another beaded path in any desired location on the surface of a substrate, it is also possible to fabricate beaded paths that will adjoin or cross the already existing beaded path (paths) on the surface of a substrate. Example 15 presents the process of fabricating subsequent beaded paths, and images of the crossed beaded paths are shown in FIG. 14 (a-b).

In the preferred embodiment of the process according to the invention, when the beaded structure connecting the dispersion meniscus and the surface is formed the electric current flowing between the microcapillary and the surface of the substrate is limited, and this prevents releasing high power that would lead to heating up the beaded structure and its degradation, or heating up the liquid of capillary bridges in the beaded structure. Such heating of the liquid of capillary bridges may cause its evaporation or formation of air bubbles that could lead to breaking the beaded structure. For limiting the current any high-voltage electronic circuit for current limiting can be used or voltage generated from a device that has the possibility of controlling amperage.

Capillary Bridges

In the embodiment of the process of fabricating a beaded path according to the present invention, capillary interactions are present, and these are related to the formation of so-called liquid capillary bridges. There are three types of liquid capillary bridges. The first one (bridge type I) forms while the particle is being pulled out of the dispersion and is formed between the particle and the dispersion surface. The capillary interaction of that bridge is in the direction opposite to the dielectrophoretic force acting on the particle, which is in the direction towards the substrate. This capillary interaction, which needs to be overcome through the application of voltage of a certain magnitude, was mentioned already in the section describing the meaning of the electric field. When the particle is pulled out from the dispersion bridge type I transforms into bridge type II, which is created between the just removed particle and the particle following it, which is just being pulled out from the dispersion. Such bridge type II is a favourable entity because it holds the particle structure playing, in some sense, the role of elastic glue, giving the beaded structure flexibility important for its deposition on the surface of a substrate. As the particle reaches the surface of a substrate, a thin layer of liquid surrounding the particle and part of the liquid from bridge type II creates capillary bridge type III, which is formed between the surface of the substrate and the particle situated on that surface of the substrate, providing adhesion of the particle to that surface.

Fixing a Beaded Path

According to the process presented herein, once the beaded path is fabricated the particles comprising the beaded path may undergo different processes causing their merging. Depending on the material type of the particles of the path, the merging may be mediated using different physical phenomena. For example, solid particles may undergo a sintering process, e.g. using a microwave oven or a hot plate, so that the particles that are in touch bond one another, and this may lead to creation of a solid path approximately in a form of a cylinder. Thus, it is possible to form solid paths of a beaded path, which is not possible the other way around. The process of particle sintering of a beaded path fabricated according to one of the embodiments of the process is presented in Example 9, and the images of that process are presented in FIG. 9 (*b-e*), whereas the process of fabricating the beaded path that underwent the sintering process is presented in Example 13, and the images of fixed particle structure after the sintering are presented in FIG. 12.

For fixing a beaded path and/or its protection against the impact of the environment (for example, particle oxidation or corrosion) by surrounding the particles of the path with a coating, the properties of the dispersion liquid can be employed, for example, phase change after path fabrication. In Example 11, the beaded path was fabricated using paraffin, which was heated up above its melting temperature during path fabrication, and soon after the beaded path was fabricated on the surface of a substrate, the paraffin became solid thus fixing the structure, and in addition prevented particle degradation by coating particles. It is also possible to use a liquid which solidifies soon after the fabrication of a beaded path, for example, an epoxy resin mixed with a volatile organosilicon compound. Utilization of the properties of a liquid is advantageous, as it does not require any additional operations after the fabrication of a beaded path.

Advantages of the Invention

In the claimed invention, as the formed beaded structure is deposited on the surface of the substrate both electric phenomena and capillary interactions are used for pulling particles out of a dispersion, their simultaneous self-organization and deposition on the surface of a substrate. From the technological point of view, this process may resemble for example ink-jet printing, in which the ink nozzle is moved relative to a sheet of paper during printing. Herein, a metallic microcapillary wired to voltage serves as such an ink nozzle, to which a particle dispersion is provided and conveyed through it. The beaded structure composed of particles aligned one by one is formed between the microcapillary and the surface of a substrate, and at the same time the structure is deposited on the surface of a substrate by appropriately moving the microcapillary relative to the substrate and/or by appropriately moving the substrate relative to the microcapillary.

The process of fabricating a beaded path on the surface of a substrate according to the present invention has features of mouldless printing, that is, it provides a possibility of continuous printing without the need of using a matrix, a mask, etc. as the mould, and it relies on the self-organization method using electric field. The utilization of the phenomenon of particle self-organization in the mouldless printing presented by the inventors has not been disclosed yet. Typically, in mouldless printing techniques thermal, piezoelectric or electrohydrodynamic liquid flow phenomena are used to eject small droplets out of a dispersion of nanoparticles. Each droplet is deposited in the right place and time on the surface of a substrate, and such a working mode is called "droplet-on-demand". In the process of the invention, however, particles rather than particle dispersion droplets are transferred, and that is the key difference between this invention and the measures already known in the art. In accordance with the invention, the particles are transferred on the surface of a substrate in the manner ensuring control at the level of an individual particle, i.e., the particles are transferred and simultaneously aligned one by one in a right place on the surface of a substrate. Such a working mode may be called "particle-on-demand" similarly to the term of the "droplet-on-demand" working mode. It was possible to achieve such delivery of particles on the surface of a substrate and formation of beaded paths by taking advantage of the phenomenon of dielectrophoretic organization of particles in electric field.

In comparison with the known methods mentioned in publications (i-ii), in which particle structures are formed in liquid environment, in the process of the invention the beaded structures of particles that create beaded paths on the surface of a substrate are formed outside the liquid environment. This indicates that in the process of the invention there is no need for removing the dispersion liquid. The only liquid remains in the capillary bridges, which ensures both particle adhesion to the surface of a substrate and attracting interactions between adjacent particles (the process, however, does not exclude the possibility of formation of such paths on the surface of a substrate covered fully or partially by a liquid immiscible with the dispersion liquid). Moreover, unlike in the known methods disclosed, for example, in publications (i-ii), in the process of the invention there is no need for particle modification for the permanent particle structure forming a beaded path to be maintained after turning off the external source of electric field. Additionally, in the process of the invention uncontrolled agglomeration of particles does not occur, as is the case in the method presented in the state of the art, for example, in publication (ii).

Moreover, compared with the known methods presented, for example, in publication (v), in which a beaded structure is pulled out from a dispersion, the process of the invention enables fabricating beaded paths of unlimited length. In addition, the paths fabricated according to the invention are formed in a continuous manner (they are printed), in contrast to the known method presented, for example, in publication (v), in which only very short paths can be fabricated, and thus to form a longer beaded path on the surface of a substrate these short path fragments will have to be connected (for micrometer structures this is a great challenge). This, in turn, would involve multiplication of steps of path fabrication. In addition, it has to be noted that the formation of beaded structures (i.e., pulling them out from the liquid before their further deposition on the surface of a substrate) according to the method described in publication (v) is realized at a rate lower than 10 μm/s for particles with a size of tens of μm. Otherwise, if the rate of formation (pulling the particles out from the dispersion) of beaded structure is increased such structure becomes unstable; hence, it is impossible to deposit it on the surface of a substrate. In the process of the invention, the formation of beaded structures with their simultaneous deposition on the surface of a substrate to fabricate beaded paths involves one step, and not four steps (pulling out, trimming, transferring, depositing) as is the case of the method according to publication (v); and the formation time of beaded structure is about hundred times shorter than the time needed to form a beaded path (de facto with limited length) according to the method described in publication (v). It should be emphasized again that beside the fast rate of path fabrication it is also important that the process according to the invention enables fabricating the path in a continuous manner, that is with unlimited length of the path, as well as modifying the pattern of the path without a need for introducing changes in the process, as is the case in the known methods, for example, those considered printing methods where a mould is used (for example, lithographic or screen printing methods). In comparison with the method presented in publication (v), the process of the invention ensures controllable termination of the fabrication of a beaded path on the surface of a substrate by turning off the voltage, whereas in the method described in publication (v) the beaded path being fabricated must have the same length as the beaded structure being pulled out from the dispersion.

The process of the present invention also enables fabricating a beaded path that adjoins or crosses the existing beaded path/paths on the surface of a substrate, and thereby creating more complex patterns on the surface of the substrate.

An important advantage of the process proposed by the inventors is that the microcapillary does not move on the surface of a substrate that might otherwise have resulted in the mechanical damage of both the surface of the substrate and the microcapillary.

Summarizing the advantageous technical effects of the present invention, the inventors developed a new process of fabricating beaded paths on the surface of a substrate having the following features: The process (I) enables the fabrication of a beaded structure from particles aligned one by one and allows depositing particles of the beaded structure on the surface of a substrate in a form of a linear shape or other more complex arbitrary non-linear patterns; (II) enables working in a continuous mode so that beaded paths of unlimited length can be fabricated; (III) path fabrication takes only one step, i.e., the formation of the beaded structures and their deposition on the surface of a substrate occurs simultaneously; (IV) enables using particles with a wide range of sizes and materials composition, wherein the particles forming a beaded path do not require any pretreatment (functionalization), i.e., the fabricated path remains stable after turning off the external electric field through the so-called capillary bridges which are automatically formed during the deposition process; (V) the fabricated paths are formed outside the liquid environment; however, the process does not exclude the possibility of fabricating a beaded path on the surface of a substrate, which is covered fully or partially by a liquid immiscible with the dispersion liquid; (VI) enables fabricating paths on a flat, wavy or curved surface, or on a surface with steps or cracks, and also allows the use of substrates having a surface made of non-conductive or semiconducting materials, substrates that are rigid or flexible, substrates with any optical properties (for example, transparent, opaque), and it also allows fabricating beaded micropaths on liquid absorbing surfaces; (VII) enables fabricating beaded paths on the surface of a substrate so that the paths retain their properties without a continuous input of external energy, i.e., after turning off the electric field initially used for fabricating them; (VIII) enables efficient particle usage, i.e., all particles deposited on a substrate are employed in path fabrication; (IX) ensures that the surface of a substrate remains clean, i.e., outside of the areas with the fabricated paths there is no residual material which is used for path fabrication (particles, liquid); (X) the process is easily scalable, i.e., multiple microcapillaries can be used at the same time, which comprises electrodes moving in a non-collisional manner above the surface of a substrate, and this not only allows the simultaneous fabrication of multiple paths, but also fabrication of paths of different sizes and properties and also paths which can be joined or crossed with the already formed paths.

The beaded paths fabricated in accordance with the process of the invention may be used in electromagnetic energy transport; production of granular conductors, biological or chemical sensors, biomedical labelling, or other applications that rely on anisotropy (unidirectionality) of a given physical property, for example in photonic materials or optomechanical materials. Linear paths made of colloidal particles may be used in the production of light emitting diodes (single-nanowire LEDs), transistors, or artificial flagella. Paths fabricated from soft-matter particles, for example, microgel particles, may be used in the production of biological tissues. The paths may also be used in the regeneration of damaged paths on the surface of a substrate.

The present invention will be now illustrated by the examples that are not limiting the scope of protection as defined in the claims of the invention.

BRIEF DESCRIPTION OF DRAWINGS

FIG. 5 (d-f) presents microscope images taken from above and towards the substrate illustrating the fabricated non-linear beaded paths in the shape of (d) letter 'C', (e) sine wave, and (f) square wave, respectively, according to Example 5.

FIG. 16 (c-d) is a set of images illustrating the fabricated beaded path on the surface of a substrate covered with a layer of liquid with thickness (c) greater and (d) smaller than particle size, according to Example 19.

Figure 2:
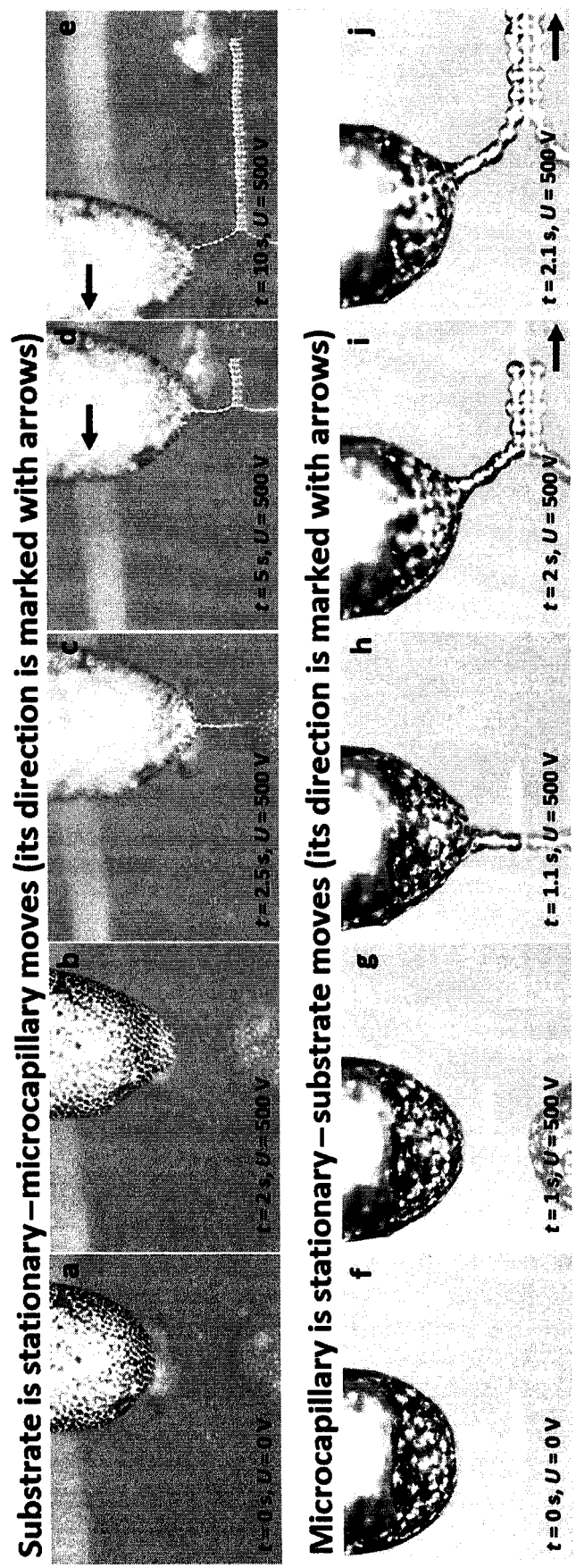
FIG. 2 (a-j) is a set of images illustrating the steps of the process of fabricating a beaded path on the surface of a substrate according to two embodiments of the present invention, in which particles of different sizes are used; two different modes of microcapillary movement relative to the substrates, according to Examples 1 and 2, are also presented.
Figure 3:
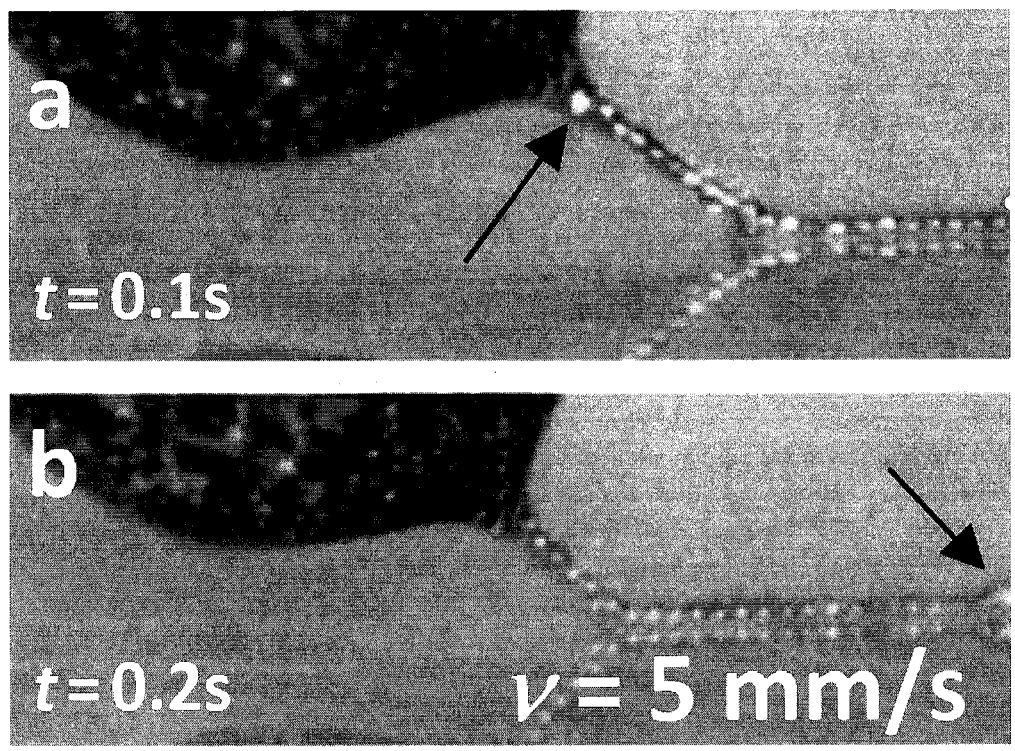
FIG. 3 (a-b) is a set of images illustrating the rate of fabrication of a beaded path on the surface of a substrate according to one embodiment of the present invention, according to Example 3.
Figure 4:
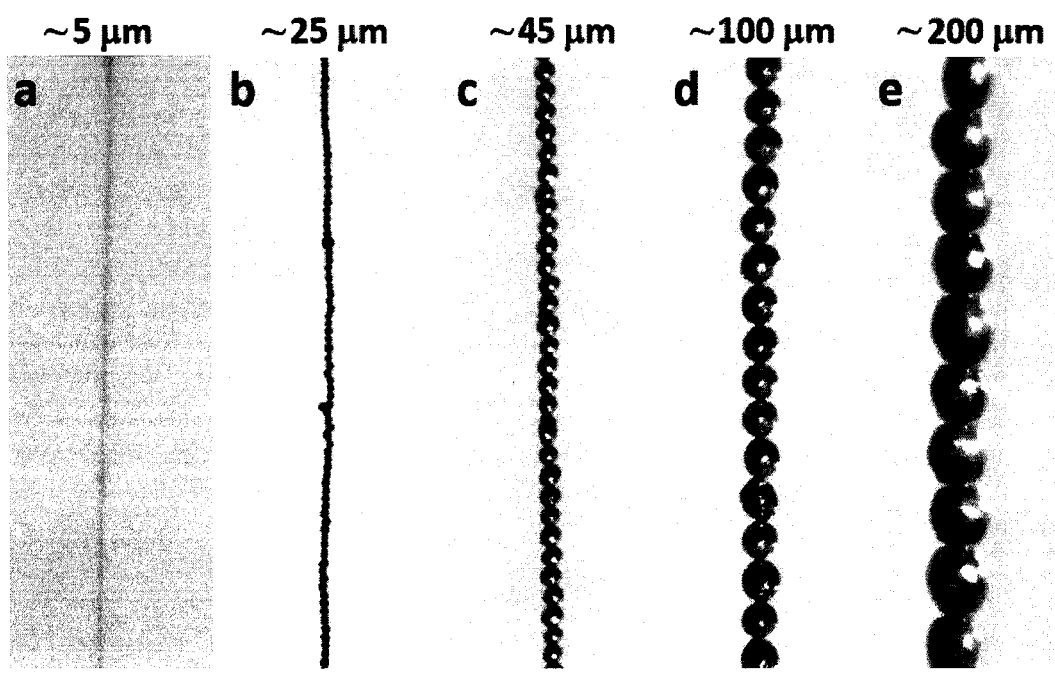
FIG. 4 (a-e) is a set of images of fabricated linear beaded paths composed of stainless-steel particles of different average sizes, (a) 5 µm, (b) 25 µm, (c) 45 µm, (d) 100 µm and (e) 200 µm, respectively, according to Example 4.
Figure 5:
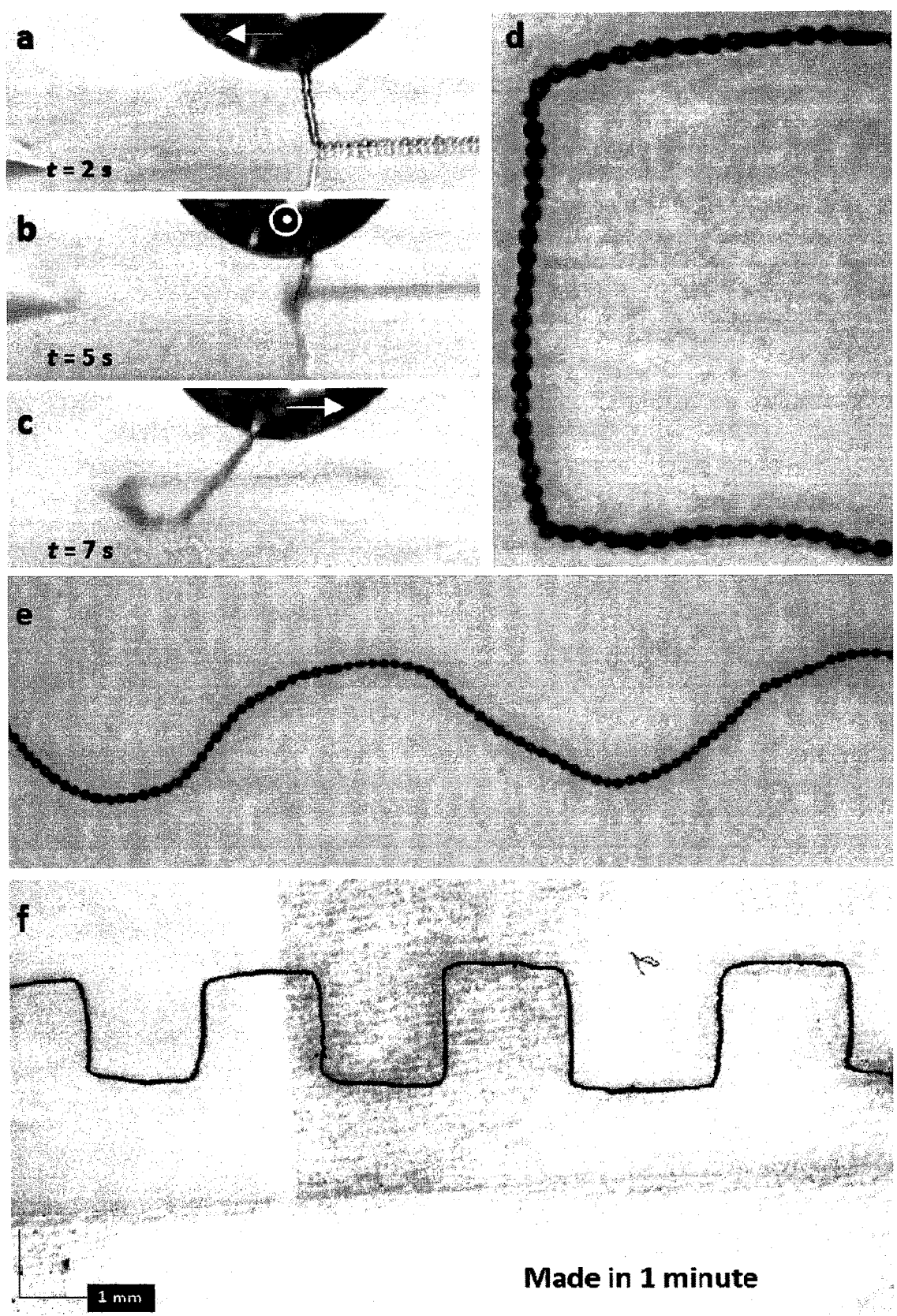
FIG. 5 (a-c) is a set of images illustrating the steps of the process of fabricating a non-linear beaded path on the surface of a substrate forming a C-shaped letter according to one embodiment of the present invention, at times t=2 s, t=5 s, t=7 s, respectively.
Figure 6:
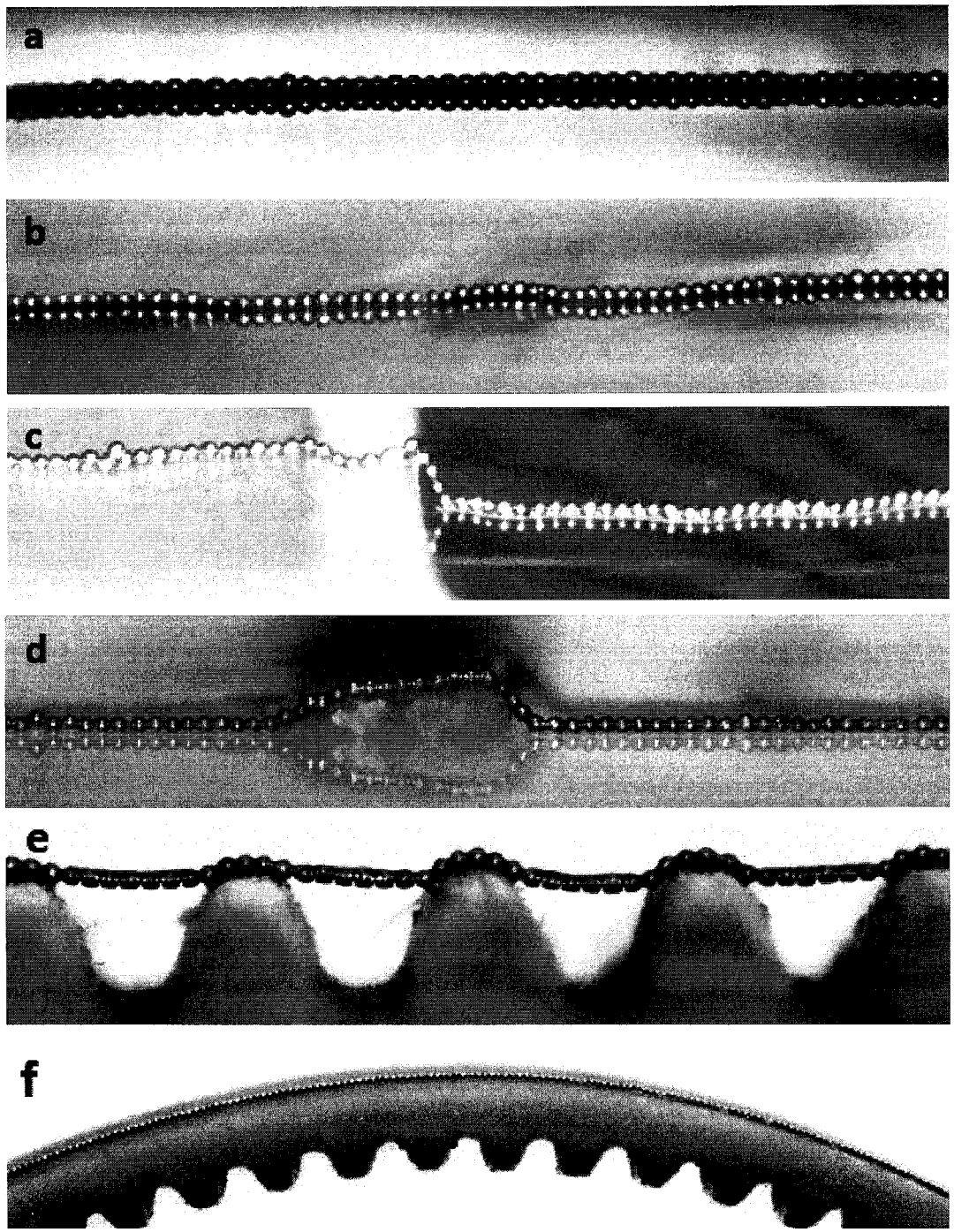
FIG. 6 (a-f) illustrates linear beaded paths fabricated on different surface morphologies: (a) flat surface, (b) wavy surface, (c, d) surface with steps, (e) surface with cracks, and (f) curved surface, according to one embodiment of the present invention, according to Example 6.
Figure 7:
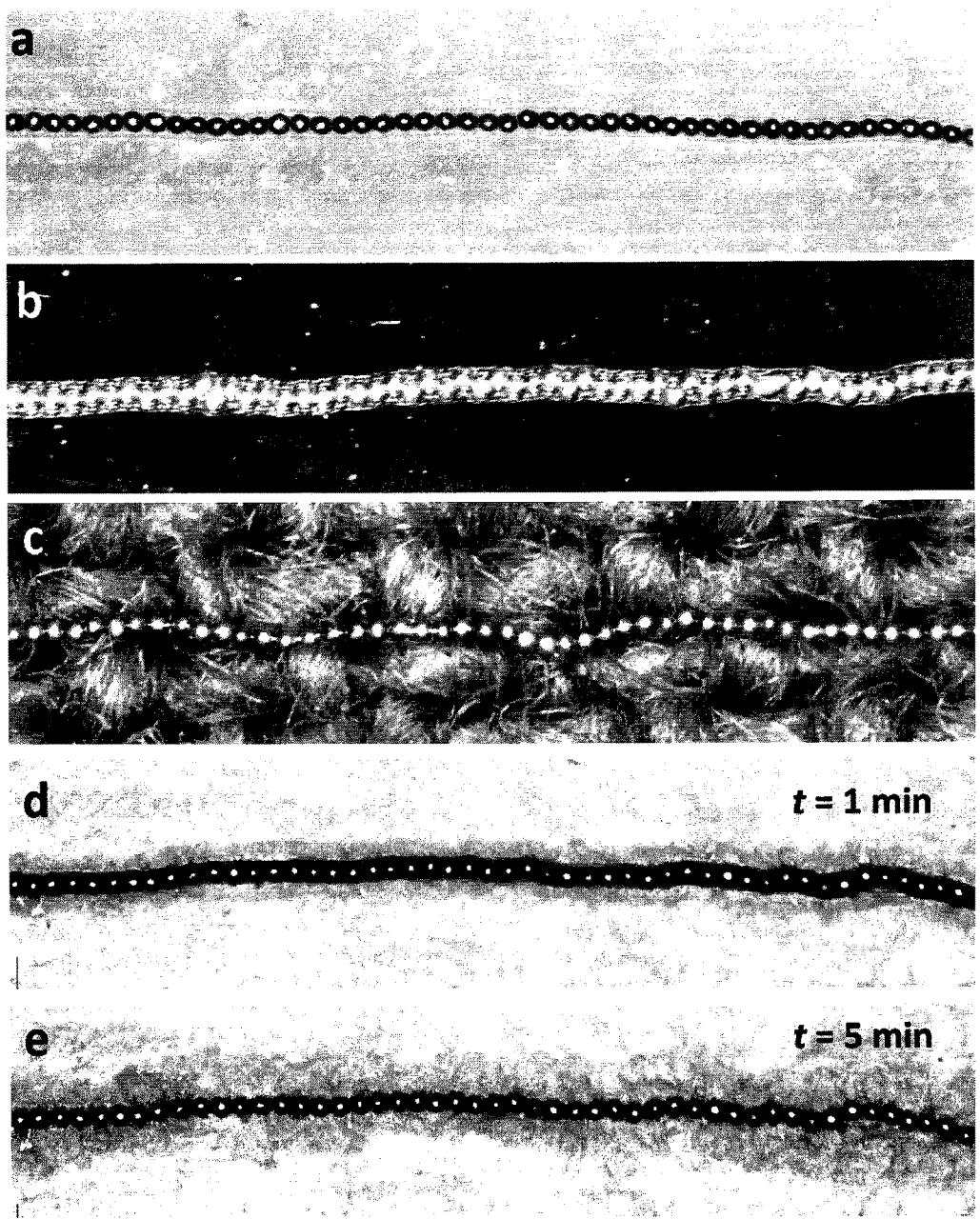
FIG. 7 (a-e) illustrates beaded paths fabricated according to one embodiment of the present invention on substrates made of different materials: (a) flexible polymer foil, (b) crystalline silicon wafer, (c) cotton fabric, and (d, e) cellulose paper, according to Example 7. Images in panels (d) and (e) were taken 1 min and 5 min, respectively, after the beaded path was formed on the paper surface, and they illustrate the absorption of liquid by the substrate.
Figure 8:
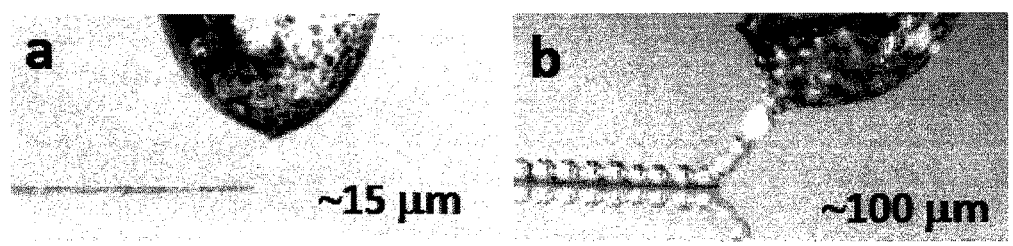
FIG. 8 (a-b) is a set of digital microscope images taken during the fabrication of beaded paths of core-shell particles with different average sizes of (a) 15 µm and (b) 100 µm, respectively, according to Example 8.
Figure 9:
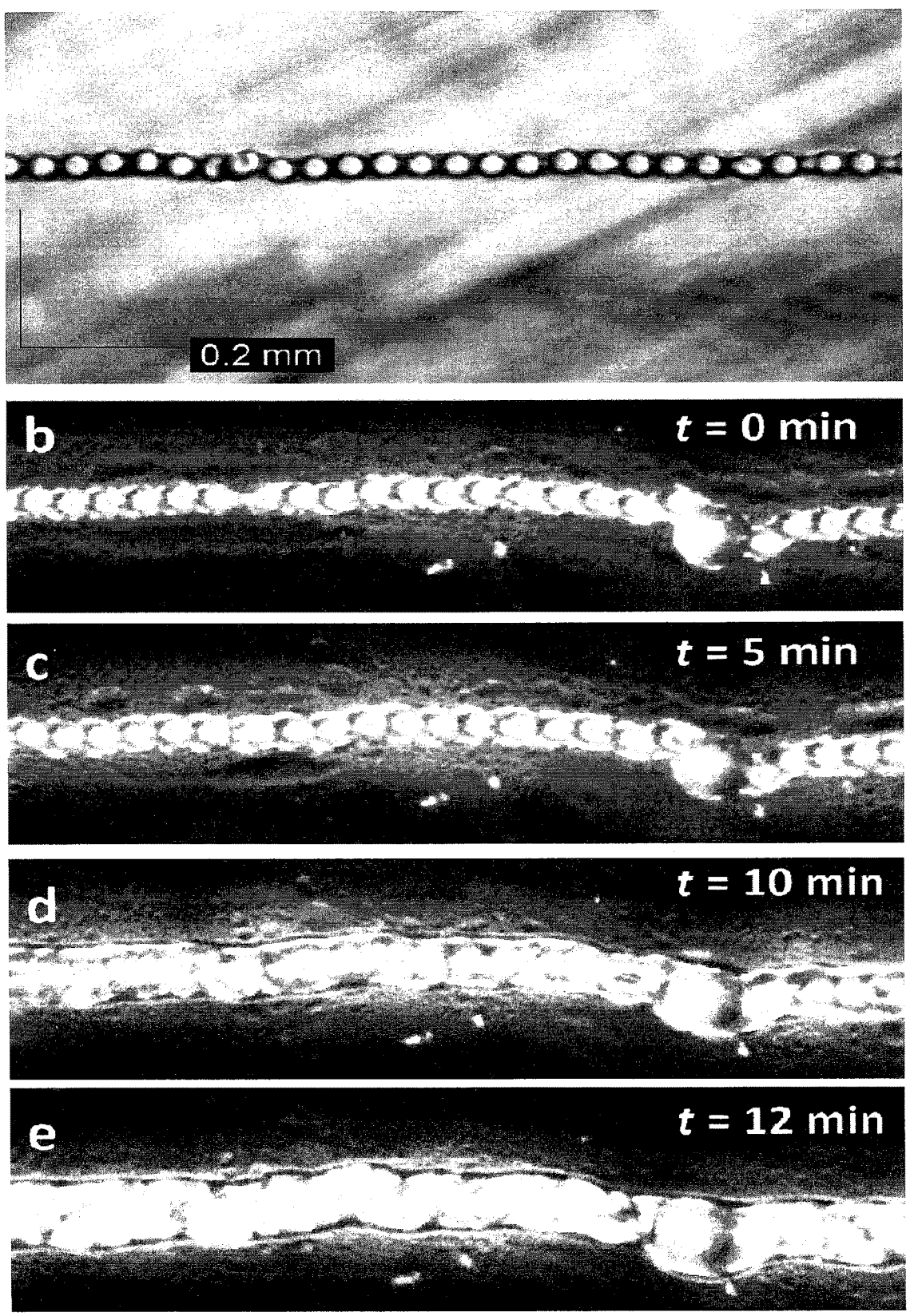
FIG. 9 (a-e) presents (a) an image of a fabricated beaded path of modified polystyrene particles with an average size of 40 µm, and (b-e) four images illustrating a sintering process of the fabricated beaded path, according to Example 9.
Figure 12:
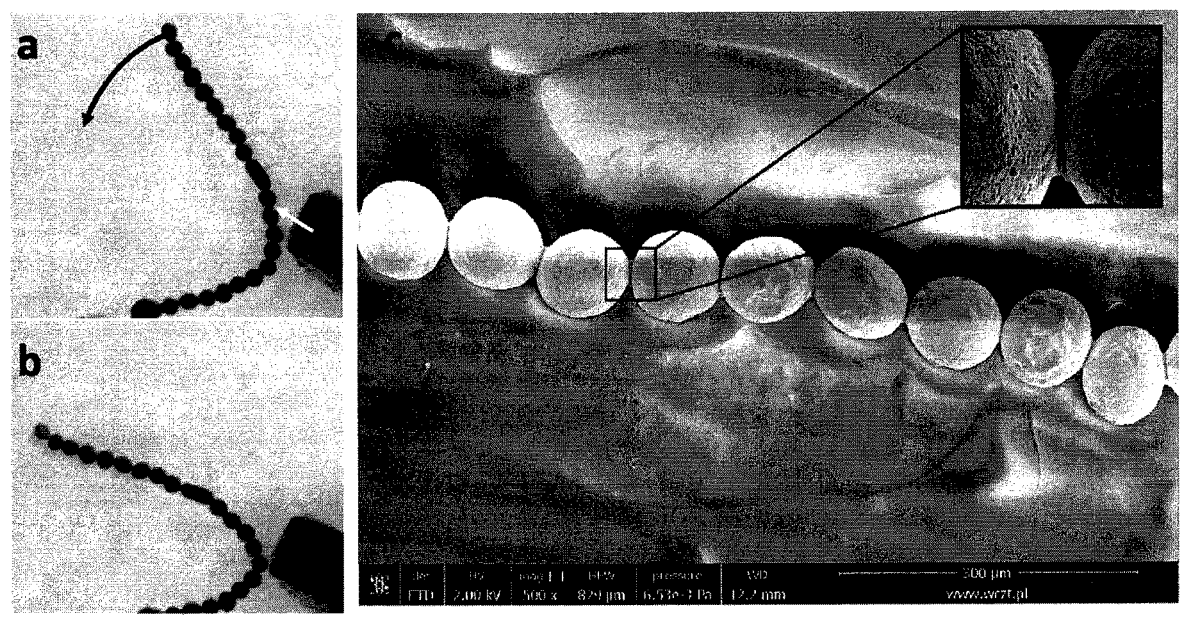
FIG. 12 (a-c) is a set of images illustrating the mechanically strengthened beaded structure observed through (a-b) a digital microscope and (c) an electron microscope. A high magnification SEM image depicts the permanent bond between the particles after the sintering of the beaded structure, according to Example 13.
Figure 13:
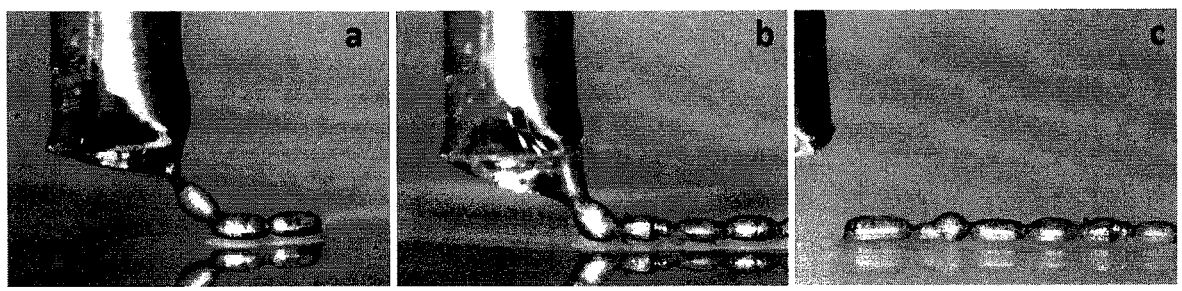
FIG. 13 (a-c) is a set of images illustrating steps of the process of fabricating a beaded path on the surface of a substrate according to one embodiment of the present invention, in which non-spherical microparticles were used, according to Example 14.
Figure 14:
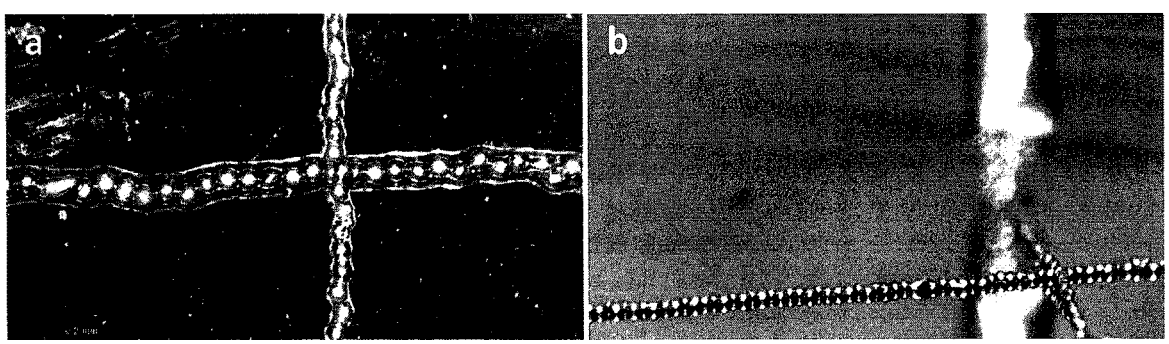
FIG. 14 (a-b) is a set of images from different perspectives illustrating two crossed beaded paths, according to Example 15.
Figure 16:
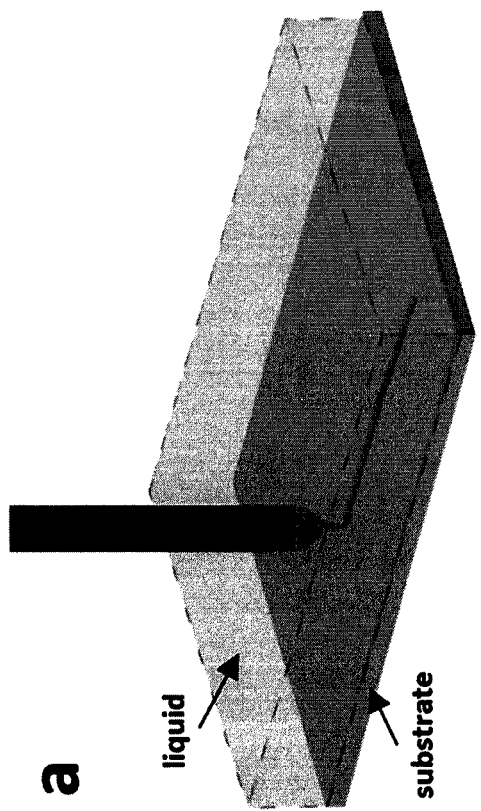
FIG. 16 (a-b) is a schematic diagram illustrating the fabrication of beaded paths in a liquid environment.
Figure 16:
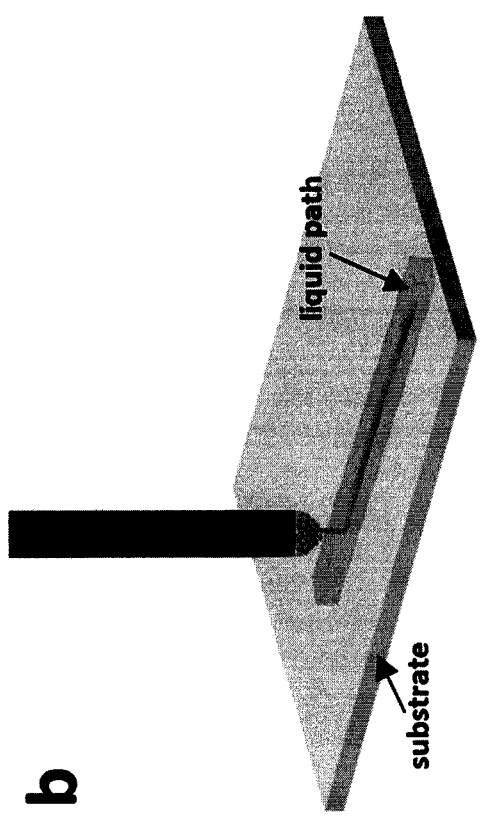
Figure 16:
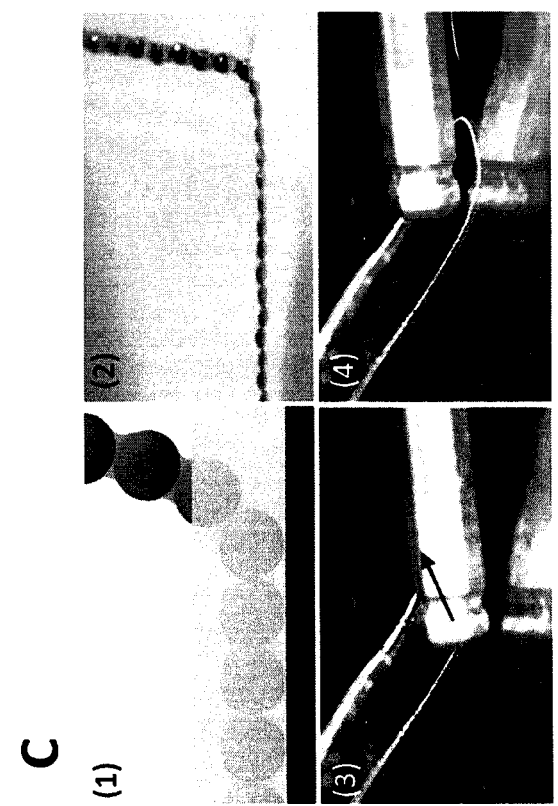
Figure 16:
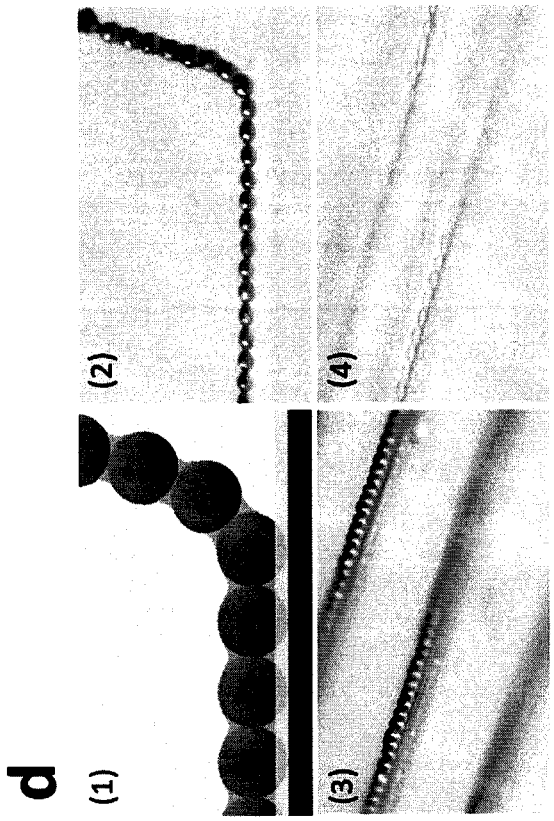
Figure 17:
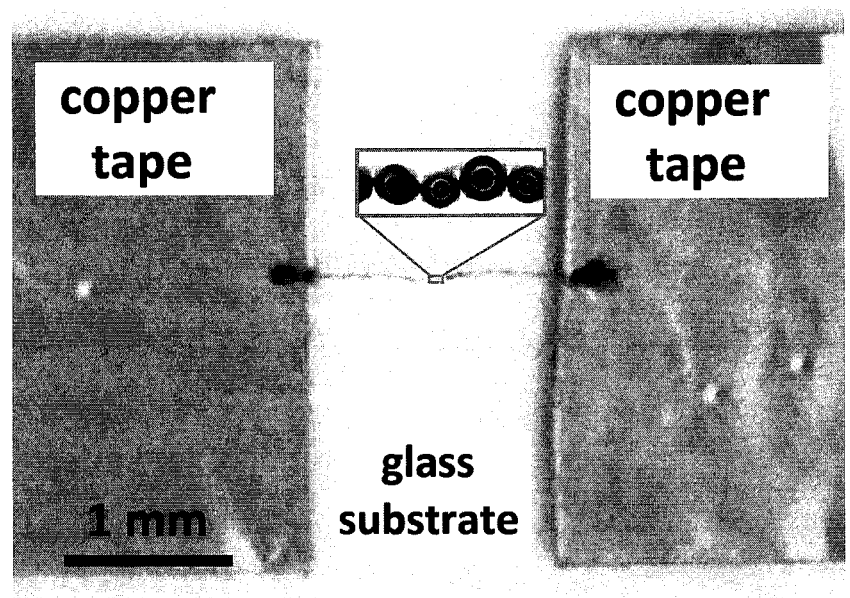
FIG. 17 is an image illustrating the fabricated beaded path connecting two copper electrodes, according to Example 17.

The images presented on FIG. 2 (a-j), FIG. 3 (a-b), FIG. 5 (a-c), FIG. 6 (a-d), FIG. 8 (a-b), FIG. 13 (a-c), FIG. 14 (b) and FIG. 16 (c-d) were taken at an angle of about 20° relative to the surface of a substrate (as a side view); therefore a mirror reflection of the particles from the surface of a substrate is shown on these images. The images presented on FIG. 4 (a-e), FIG. 5 (d-f), FIG. 7 (a-e), FIG. 9 (a), FIG. 10, FIG. 11 (a-b), FIG. 12 (a-c), FIG. 14 (a), and FIG. 17 were taken from above, that is, perpendicular to the surface of a substrate.

EXAMPLES

Figure 1:
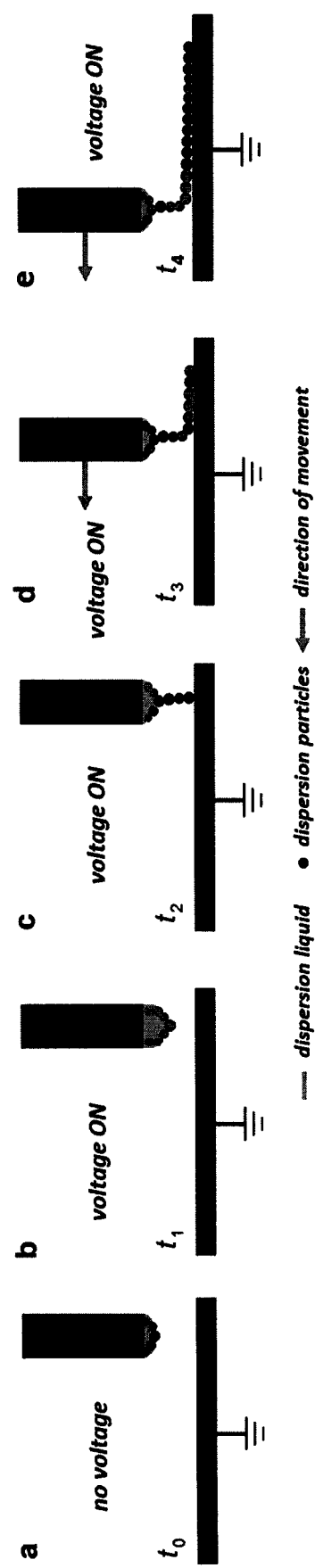
FIG. 1 (a-e) is a schematic diagram illustrating the steps of the process of fabricating a beaded path on the surface of a substrate, at times $t_0$ to $t_4$, respectively.

A non-limiting embodiment of the present invention was schematically presented in FIG. 1 (a-e), where at time t0 the microcapillary with the formed particle-dispersion meniscus is placed above the surface of a substrate. At time $t_1$ (FIG. 1 (b)) voltage is supplied to the microcapillary to initiate the process of formation of the beaded structure, which is formed from the dispersion meniscus towards the surface of the substrate. In this process, the particles first deform the dispersion meniscus, as presented in FIG. 1 (b), and then the first particle is pulled out from the dispersion meniscus followed by other particles forming in this way a structure that resembles a bead necklace of particles in appearance (a beaded structure). The beaded structure reaches the surface of the substrate and is oriented roughly perpendicularly to that substrate (FIG. 1 (c)). In the next step, the microcapillary is moved relative to the substrate (or the substrate is moved relative to the microcapillary). This results in sequential deposition of the particles of the formed beaded structure nearest to the surface, and the simultaneous pulling of other particles (sequentially) out of the dispersion, and thus, rebuilding the beaded structure at the side of the dispersion meniscus. That, in turn, enables continuous deposition of the particles of the beaded structure on the surface of the substrate. The subsequent steps of deposition of the beaded structure on the surface of the substrate at times $t_3$ and $t_4$ are presented in FIG. 1 (d) and FIG. 1 (e), where microcapillary movement above the surface of a substrate is indicated by the arrow. Voltage is continuously supplied during the deposition of the structure on the surface. After a path with the desired pattern is fabricated, voltage is turned off and the microcapillary is moved to a new place in order to initiate fabrication of the next path.

Example 1

In the present example, silicone oil (Rhodorsil Oils 47, purchased from VWR, catalogue number 83851.290, viscosity ~350 mPa·s, electrical conductivity ~$10^{-11}$ S/m and density ~0.97 g/cm$^3$; all measured at 25° C.) was used to prepare a dispersion of electrically conductive particles made of stainless steel (purchased from Cospheric, USA, average size ~45 μm and density ~7.8 g/cm$^3$). Particle concentration was ~50% by volume. The dispersion was conveyed from the container (syringe, BD Discardit, 5 mL) to the conductive microcapillary (commercially available stainless-steel needle with the outer diameter 0.6 mm, TERUMO) through a polymer tube. The microcapillary also constituted an electrode. The dispersion was supplied to the microcapillary using a dosing unit (syringe pump, neMESYS from CETONI) driven by a feedback loop system that included an optical system (digital microscope, Dino-lite AM7315) connected to a computer (DELL Latitude E 7470). The computer was used to record and analyze images from the microscope (i.e., the presence and shape of the dispersion meniscus at the outlet end of the microcapillary) with commercially available software (MATLAB, Image Processing Tolbox), so that the dosing unit received feedback information. The dispersion provided to one end of the microcapillary formed a convex meniscus at the second (outlet) end of that microcapillary. The second end of the microcapillary was positioned above the surface of a substrate (FIG. 2 (a)) on which the particle structure was deposited to ultimately form a beaded path. The distance from the dispersion meniscus to the surface of the substrate was about 300 μm, that is about seven times the particle size. A voltage signal was provided to the microcapillary through an electrical wire with one end soldered to that microcapillary and the other end connected to the source of alternating field (voltage amplifier, Ultravolt HVA, model 5HVA24-BP1). In this example, square-wave voltage with frequency of 1 kHz and mean voltage ($V_{rms}$) of 500 V was applied. The application of such voltage resulted first in meniscus deformation (FIG. 2 (b)), followed by the formation of a beaded structure between the meniscus and the surface of a substrate. (FIG. 2 (c)). The structure was formed in less than 0.5 s. In the next step, the microcapillary was moved relative to the substrate (with an average speed of about ~0.25 mm/s), which resulted in sequential alignment of the particles of the formed beaded structure nearest to the surface, and simultaneous pulling of other particles (sequentially) out of the dispersion, and thus, rebuilding the beaded structure at the side of the dispersion meniscus, and that enabled the continuous deposition of the particles of the beaded structure on the surface of the substrate. FIG. 2 (*d*) and FIG. 2 (*e*) illustrate the successive steps of the deposition of the beaded structure on the surface of a substrate, at time t=5 s and t=10 s. Microcapillary movement above the surface of the substrate (to the left) is indicated by the arrow. Voltage was turned on during the formation of the beaded structure and its deposition on the surface of a substrate leading to the fabrication of the beaded path. After the path with the desired pattern was fabricated, the voltage was turned off and the microcapillary was moved to a new position in order to initiate fabrication of the next path. A microscope glass slide made of soda-lime glass was used as the substrate.

Example 2

In the present example, castor oil (Rhodorsil Oils 47, purchased from Sigma-Aldrich, catalogue number 83912, viscosity ~700 mPa·s, electrical conductivity ~$10^{-10}$ S/m and density ~0.96 g/cm$^3$; all measured at 25° C.) was used to prepare a dispersion of electrically conductive particles made of stainless steel (purchased from Cospheric, USA, with an average size ~100 μm and density ~7.8 g/cm$^3$). Particle concentration was ~40% by volume. The dispersion was conveyed from the container (syringe, BD Discardit, 5 mL) to the conductive microcapillary (commercially available stainless-steel needle with the outer diameter of 0.9 mm, TERUMO) through a polymer tube. The microcapillary also constituted an electrode. The dispersion was supplied to the microcapillary in the same way as in Example 1. The dispersion delivered to one end of the microcapillary formed the convex meniscus at the second (outlet) end of that microcapillary. The second end of the microcapillary was positioned above the surface of a substrate (FIG. 2 (*f*)), on which the particle structure was deposited to ultimately form a beaded path. The distance from the dispersion meniscus to the surface of the substrate was about 500 μm, that is about five times the particle size. The voltage signal was provided to the microcapillary through an electrical wire with one end soldered to that microcapillary and the other end connected to the source of alternating field (voltage amplifier, Ultravolt HVA, model 5HVA24-BP1). In this example, square-wave voltage with frequency of 1 kHz and mean voltage ($V_{rms}$) of 500 V was applied. Similarly, as in Example 1, the application of such voltage resulted first in meniscus deformation (FIG. 2 (*g*)) followed by the formation of a beaded structure between the meniscus and the surface of the substrate. (FIG. 2 (*h*)). The structure was formed in less than 0.1 s. In the next step, the microcapillary was moved relative to the substrate (with the average speed of about ~1 mm/s), which resulted in sequential deposition of the particles of the formed beaded structure that were nearest to the surface, and simultaneous pulling of other particles (sequentially) out of the dispersion, and thus, rebuilding the beaded structure at the side of the dispersion meniscus, and that enabled the continuous deposition of the particles of the beaded structure on the surface of a substrate. FIG. 2 (*i*) and FIG. 2 (*j*) illustrate the successive steps of the deposition of the beaded structure on the surface of a substrate, at time t=2 s and t=2.1 s. The microcapillary was moved above the surface of the substrate to the right, as indicated by the arrow. Voltage was supplied all the time during the formation of the beaded structure and its deposition on the surface of a substrate leading to the fabrication of the beaded path. After the path with the desired pattern was fabricated, the voltage was turned off and the microcapillary was moved to a new position in order to initiate the fabrication of the next path. A microscope glass slide made of soda-lime glass was used as the substrate.

Example 3

In the present example, a beaded path was fabricated in the same manner and using the same materials as in Example 1, except that the microcapillary was moved relative to the substrate while the beaded structure was deposited on the surface of the substrate at an average speed of ~5 mm/s (that is more than twenty times faster than in Example 1), and this is illustrated in FIG. 3 (*a*) and FIG. 3 (*b*). This example demonstrates well the efficiency of the process concerning the rate of path fabrication.

Example 4

In the present example, silicone oil (Rhodorsil Oils 47, purchased from VWR, catalogue number 6678.1000, viscosity ~50 mPa·s, electrical conductivity ~$10^{-11}$ S/m and density ~0.96 g/cm$^3$; all measured at 25° C.) was used to prepare a dispersion of electrically conductive particles made of stainless steel (purchased from Cospheric, USA). Particles of different average size, namely 5 μm, 25 μm, 45 μm, 100 μm and 200 μm, were used in each of the five experiments performed in this Example. Particle density was ~7.8 g/cm$^3$. The dispersion was conveyed from the container (syringe, BD Discardit, 5 mL) to the conductive microcapillary (commercially available stainless-steel needle with the outer diameter of 0.9 mm, TERUMO) through a polymer tube. The microcapillary also constituted an electrode. The dispersion was supplied to the microcapillary in the same way as in Example 1, so was microcapillary positioning and movement. As in Examples 1-3, square-wave voltage with frequency of 1 kHz and the mean value ($V_{rms}$) of 500 V was applied to form the beaded structures. FIG. 4 (*a-e*) presents five images of fabricated linear beaded paths made of stainless-steel particles of different average sizes, (a) 5 μm, (b) 25 μm, (c) 45 μm, (d) 100 μm and (e) 200 μm. A microscope glass slide made of soda-lime glass was used as a substrate.

Example 5

In the present example, non-linear beaded paths were fabricated by appropriately moving the microcapillary relative to the substrate. FIG. 5 (*a-c*) illustrates images from the experiment, in which the microcapillary was initially moved from right to left (FIG. 5 (*a*), the direction indicated by the arrow), subsequently it was moved towards the camera, indicated by the corresponding symbol in FIG. 5 (*b*), and the direction was changed so that the microcapillary was moved from left to right, as shown in FIG. 5 (*c*). As the result of this operation a beaded path in the form of a C-shaped pattern was fabricated, as shown on the microscope image taken from above, which is demonstrated in FIG. 5 (*d*). In the subsequent experiments carried out as part of this embodiment of the invention, the microcapillary was moved along and across the substrate. FIG. 5 (*e*) illustrates the image from the experiment, in which the microcapillary was moved so that a sine-wave pattern was formed, whereas FIG. 5 (*f*) illustrates the image from the experiment, in which the microcapillary was moved so that a square-wave pattern was formed. The beaded paths, illustrated in FIG. 5 (*d-f*), were fabricated using castor oil (Rhodorsil Oils 47, purchased from Sigma-Aldrich, catalogue number 83912) dispersion of electrically conductive particles made of stainless steel (purchased from Cospheric, USA with an average size ~50 μm and density ~7.8 g/cm³). The dispersion was conveyed from the container (syringe, BD Discardit, 5 mL) to the conductive microcapillary (commercially available stainless-steel needle with the outer diameter of 0.9 mm, TERUMO) through a polymer tube. The microcapillary also constituted an electrode. The dispersion was supplied to the microcapillary in the same way as in Example 1. Square-wave voltage with frequency of 5 kHz and the mean voltage value ($V_{rms}$) of 750 V was applied to form beaded structures. The average translation rate of the microcapillary relative to the substrate was ~0.2 mm/s, ~1 mm/s, and ~0.4 mm/s to fabricate paths in the form of a C-shaped pattern, sine-wave pattern, and square-wave pattern, respectively. A microscope glass slide made of soda-lime glass was used as the substrate.

Example 6

In the present example, beaded paths were fabricated on different surfaces of the substrate. FIG. 6 (*a*) presents an image from the experiment illustrating the beaded path fabricated on a flat glass surface. A linear beaded path fabricated on a wavy surface is shown in FIG. 6 (*b*). The height of the wave was approximately equal to particle size and the distance between the peaks of the wave was more than ten times the particle size. FIG. 6 (*c-d*) presents a linear beaded path fabricated on surfaces with steps of a height up to five times the particle size. FIG. 6 (*e*) shows a linear beaded path fabricated on surfaces with cracks with the separation distance about ten times the particle size. FIG. 6 (*f*) presents a linear beaded path fabricated on a curved substrate. In the present example, the beaded paths were fabricated in the same manner and using the same materials as in Example 1, with a difference in depositing beaded structures on the surface of a substrate, that is, the microcapillary was not only moved along the substrate, but it also was lifted and lowered in order to maintain the same distance between the dispersion meniscus and the substrate, i.e., about 300 μm. The following materials were used as the substrates: (a) microscope glass slide made of soda-lime glass, (b) PVC polymer film, (c) microscope glass slide made of soda-lime glass with an insulating electric tape attached to the left side of the slide, (d) microscope glass slide made of soda-lime glass with an attached piece of plasticine, (e,f) plastic polymer.

Example 7

In the present example, beaded paths were fabricated on substrates made of different materials. FIG. 7 (*a-e*) presents beaded paths fabricated on (a) flexible PVC (polyvinyl chloride) polymer film, (b) crystalline silicon n-type wafer with conductivity of approx. 4.5 S/cm from Siegert Wafer, (c) cotton fabric, and (d-e) cellulose paper with a basis weight of 200 g/m². FIG. 7 (d, e) illustrates images taken 1 min and 5 min after the beaded path was fabricated on the surface of a sheet of paper revealing liquid absorption by the substrate. The beaded paths were fabricated in the same manner and using the same materials as in Example 1, with a difference that the microcapillary was moved at an average speed of ~1 cm/s, and particles with an average size of ~100 μm were used.

Example 8

In the present example, the beaded paths were fabricated in the same manner and using the same materials as in Example 1, with a difference that particles made of glass microspheres coated by a thin (~100 nm) silver layer were used instead of stainless-steel particles. Different average sized particles, i.e., ~15 μm and ~100 μm, were used in each of the two experiments performed within this example. Density of the particles was ~2.5 g/cm³. The particles were electrically conductive and were purchased from Cospheric, USA. Digital microscope images taken during the fabrication of the beaded path on the substrate made of soda-lime glass are presented in FIG. 8 (*a-b*).

Example 9

In the present example, castor oil (purchased from Sigma-Aldrich, catalogue number 83912) was used to prepare a dispersion. Inorganic salt (TBAB, purchased from Sigma-Aldrich, catalogue number: 193119) in proportion of 50 mg to 100 mL was added to the oil, which resulted in the increase in the electrical conductivity of the oil from approximately ~$10^{-10}$ S/m to approximately ~$10^{-8}$ S/m. Modified polystyrene particles with an average size of 40 μm were used. The particles used for modification were purchased from Microbeads, Norway. Chemical modification was conducted according to the procedure described in A Mikkelsen et al., Electric field-driven assembly of sulfonated polystyrene microspheres, Materials 10(4), 329 (2017), in which the particles were sulfonated for 60 min. The chemical modification resulted in the increase in electrical conductivity by several orders of magnitude, i.e., from $10^{-11}$ S/m to $10^{-6}$ S/m, and the increase in the magnitude of the dielectric constant from approximately 2 to approximately 30. The density of the particles was ~1.1 g/cm³. The dispersion was supplied to the microcapillary in the same manner as described in Example 1. In this example, square-wave voltage with frequency of 100 Hz and the mean voltage value ($V_{rms}$) of 1000 V was applied. In order to fabricate a beaded path on a soda-lime glass substrate, the microcapillary was moved relative to the substrate. The microcapillary was moved with an average speed of approximately 0.2 mm/s. A picture of the fabricated beaded path is presented in FIG. 9 (*a*). After the beaded path was fabricated, the sintering of particles of the beaded path was initiated through heating on a hot plate at approximately 150° C. Four images illustrating particle sintering, taken before heating, after 5 min, 10 min and 12 min of heating, respectively, are presented in FIG. 9 (*b-e*).

Example 10

Figure 10:
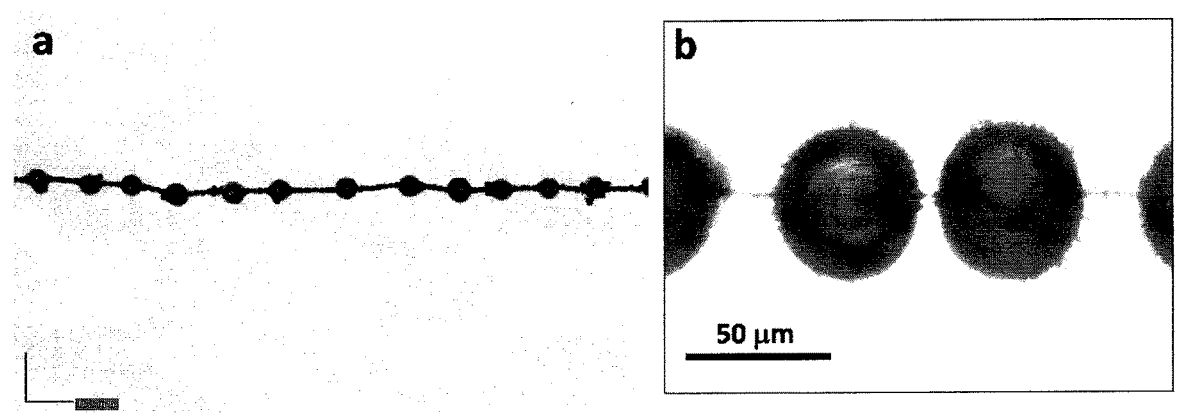
FIG. 10 (a-b) is a set of images illustrating fabricated beaded paths made of (a) copper particles and stainless-steel particles with an average size of 25 μm and 100 μm, respectively, and (b) copper particles and stainless-steel particles with an average size of 1 μm and 45 μm, respectively, according to Example 10.

In the present example, two experiments were performed, and in each of them castor oil (purchased from Sigma-Aldrich, catalogue number 83912, viscosity ~700 mPa·s, electrical conductivity ~$10^{-10}$ S/m and density ~0.96 g/cm³; all measured at 25° C.) was used to prepare dispersions of two different types of particles, i.e., particles made of different materials and of different sizes, namely copper particles (density ~8.9 g/cm³) with the average size of ~25 μm and stainless-steel particles (density ~7.8 g/cm³) with the average size of ~100 μm (FIG. 10 (*a*)), and in the second experiment copper particles with the average size of ~1 μm and stainless-steel particles with the average size of ~45 μm (FIG. 10 (*b*)). The particles were purchased from Cospheric, USA. The fabricated beaded paths were made of larger particles connected by short sections made of smaller particles. Each beaded path was fabricated in the same way as described in Example 2. The images of the fabricated beaded paths are presented in FIG. 10.

Example 11

Figure 11:
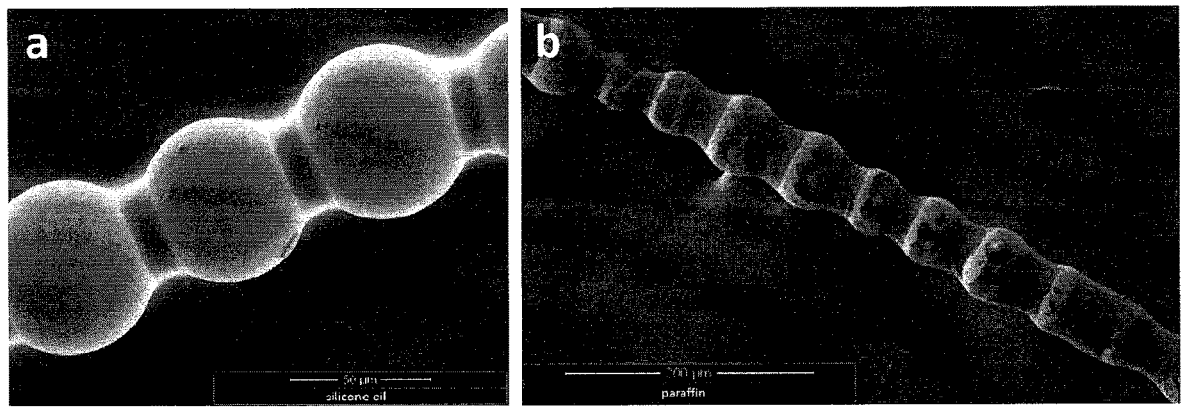
FIG. 11 (a-b) is a set of SEM images that illustrate in high magnification fabricated beaded paths of particle size of ~50 μm, wherein the particles were dispersed (a) in silicone oil, and (b) in liquid paraffin, according to Examples 11 and 12.

In the present example, the beaded path was fabricated in the same manner as in Example 1, with a difference that electrically conductive particles made of glass spheres coated with a thin (~100 nm) layer of silver (purchased from Cospheric, USA) were used instead of stainless-steel particles, and the microcapillary was moved at an average speed of ~0.01 mm/s. The average particle size was 55 µm and their density was ~1.08 g/cm$^3$. An SEM image of the fragment of the fabricated beaded path on a substrate is shown in FIG. 11 (a). Silicone oil capillary bridges formed between particles are resolved on the image.

Example 12

In the present example, the beaded path was fabricated in the same manner and using the same materials as in Example 1, with a difference that paraffin was used instead of silicone oil. The paraffin was heated above the melting point, i.e., above 60 degrees, during path fabrication. Shortly after the structure was deposited on the surface of a substrate (after a few seconds), the paraffin constituting the capillary bridges between particles solidified thus fixing the structure, and additionally coated the particles preventing their degradation, for example oxidation, etc. An SEM image of a fragment of the fabricated path on a substrate is presented in FIG. 11 (b).

Example 13

In the present example, the beaded path was fabricated in the same manner and using the same materials as in Example 2. After fabrication the path was sintered. A microscope glass, with the beaded path on it, was placed in a 750 W microwave oven and sintered for 30 seconds. The sintered particles of the beaded path adhered strongly to the surface of the substrate. Subsequently, using a pair of tweezers and gently touching the path it was examined whether the particles in the path were sintered, as presented on images in FIG. 12 (a-b), where the arrow indicates the direction of tweezers motion. Then, residues of oil forming bridges between particles were removed using isopropanol, and the beaded structure, rigidified through the sintering, was moved onto a carbon substrate of the SEM stub to observe the connections formed between the particles. FIG. 12 (c) is a SEM image illustrating the mechanically reinforced beaded structure. This high magnification SEM image reveals the permanent connection between particles after the beaded structure was sintered.

Example 14

In the present example, castor oil (purchased from Sigma-Aldrich, catalogue number 83912) was used to prepare a dispersion. Inorganic salt (TBAB, purchased from Sigma-Aldrich, catalogue number: 193119) in proportion of 50 mg to 100 mL was added to the oil, which resulted in the increase in the electrical conductivity of the oil from approximately ~$10^{-10}$ S/m to approximately ~$10^{-8}$ S/m. Electrically conductive non-spherical (approximately oval in shape) stainless-steel particles with an average length of ~300 µm, and density ~7.8 g/cm$^3$ (purchased from Cospheric, USA) were used. The dispersion was conveyed from the container (syringe, BD Discardit, 5 mL) to the conductive microcapillary (commercially available stainless-steel needle with the outer diameter of 0.9 mm, TERUMO) through a polymer tube. The microcapillary also constituted an electrode. The dispersion was supplied to the microcapillary in the same way as in Example 1. In the present example, square-wave voltage with frequency of 1 kHz and the mean voltage value ($V_{rms}$) of 500 V was applied. In order to fabricate a beaded path on a soda-lime glass substrate, the microcapillary was moved relative to the substrate. The microcapillary was moved at an average speed of approximately 0.5 mm/s. FIG. 13 (a-c) is a set of images illustrating steps of fabricating such a path, wherein FIG. 13 (c) presents a fragment of the fabricated beaded path after the voltage was turned off.

Example 15

In the present example, castor oil (purchased from Sigma-Aldrich, catalogue number 83912) was used to prepare a dispersion. Inorganic salt (TBAB, purchased from Sigma-Aldrich, catalogue number: 193119) in proportion of 50 mg to 100 mL was added to the oil, which resulted in the increase in the electrical conductivity of the oil from approximately ~$10^{-10}$ S/m to approximately ~$10^{-8}$ S/m. Electrically conductive spherical stainless-steel particles with an average size of ~100 µm, and density ~7.8 g/cm$^3$ (purchased from Cospheric, USA) were used. The dispersion was conveyed from the container (syringe, BD Discardit, 5 mL) to the conductive microcapillary (commercially available stainless-steel needle with the outer diameter of 0.9 mm, TERUMO) through a polymer tube. The microcapillary also constituted an electrode. The dispersion was supplied to the microcapillary in the same way as in Example 1. In the present example, square-wave voltage with a frequency of 1 kHz and the mean voltage value ($V_{rms}$) of 1000 V was applied to form the beaded structure, and then 500 V was applied during the fabrication of the beaded path at an average speed of 0.5 mm/s. Soon after one linear path was fabricated the voltage was turned off, the microcapillary was moved to another position, and the formation of a second beaded path was initiated, which then crossed with the first path. FIGS. 14 (a) and (b) is a set of images illustrating the fabricated beaded paths, taken with different magnification and from two different perspectives. A silicon n-type wafer with conductivity of approximately 4.5 S/cm, purchased from Siegert Wafer, was used as a substrate.

Example 16

Figure 15:
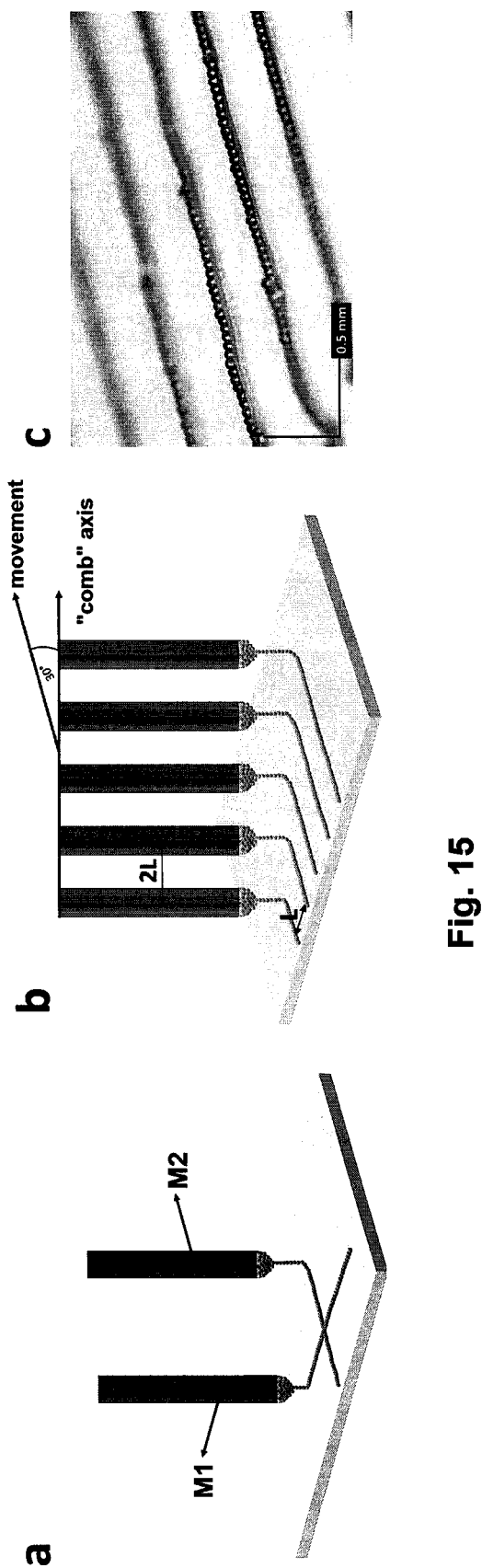
FIG. 15 (a-c) presents (a-b) a schematic diagram of two modes of microcapillary movement and (c) is a perspective image illustrating an exemplary embodiment of fabricating parallel beaded paths using a group of microcapillaries, according to Example 16.

In the present example, five microcapillaries were used, mounted on one arm of the translation stage and thus enabling their simultaneous translation. The microcapillaries were connected to the dispersion container using microfluidic tubes, and one syringe pump was used for conveying the dispersion to the microcapillaries. After the dispersion menisci were created at each microcapillary, formation of the beaded structure below each microcapillary begun by turning on the voltage (500 V, 1 kHz). Subsequently, maintaining the same voltage parameters, the microcapillaries began moving simultaneously with an average speed of approximately 0.1 mm/s. After the beaded paths were fabricated, each with a length of around 1 cm, the voltage was turned off and the microcapillaries were moved away from the substrate. A perspective image of the fabricated beaded paths is shown in FIG. 15 (c). In the present example, castor oil (purchased from Sigma-Aldrich, catalogue number 83912) was used to prepare a dispersion. Inorganic salt (TBAB, purchased from Sigma-Aldrich, catalogue number: 193119) in proportion of 50 mg to 100 mL was added to the oil. Electrically conductive spherical stainless-steel particles with an average size of ~45 μm and density of ~7.8 g/cm$^3$ (purchased from Cospheric, USA) were used.

Example 17

In the present example, castor oil (purchased from Sigma-Aldrich, catalogue number 83912) was used to prepare a dispersion. Inorganic salt (TBAB, purchased from Sigma-Aldrich, catalogue number: 193119) in proportion of 50 mg to 100 mL was added to the oil. Electrically conductive spherical stainless-steel particles with an average size of ~25 μm, and density of ~7.8 g/cm$^3$ (purchased from Cospheric, USA) were used. The dispersion was conveyed from the container (syringe, BD Discardit, 1 mL) to the conductive microcapillary (commercially available stainless-steel needle with the outer diameter 0.5 mm, TERUMO) through a polymer tube. The microcapillary also constituted an electrode. The dispersion was supplied to the microcapillary in the same way as in Example 1. In the present example, square-wave voltage with a frequency of 1 kHz and the mean voltage value ($V_{rms}$) of 1000 V was applied to form the beaded structure, and then 500 V was applied during the fabrication of the beaded path at an average speed of 0.1 mm/s. The formation of the beaded path commenced at the copper tape (HB 720A, purchased from RS Components Ltd.) attached to the glass substrate. Subsequently, by moving the microcapillary the beaded path was formed at the glass substrate and then on the second piece of the copper tape, where the beaded path formation ended. An image of the fabricated beaded path is presented in FIG. 17. After the beaded path was fabricated, its electrical resistance was measured by placing multimeter probes to pieces of the copper tape attached to the glass substrate. The measured resistance was ~5Ω.

Example 18

Figure 18:
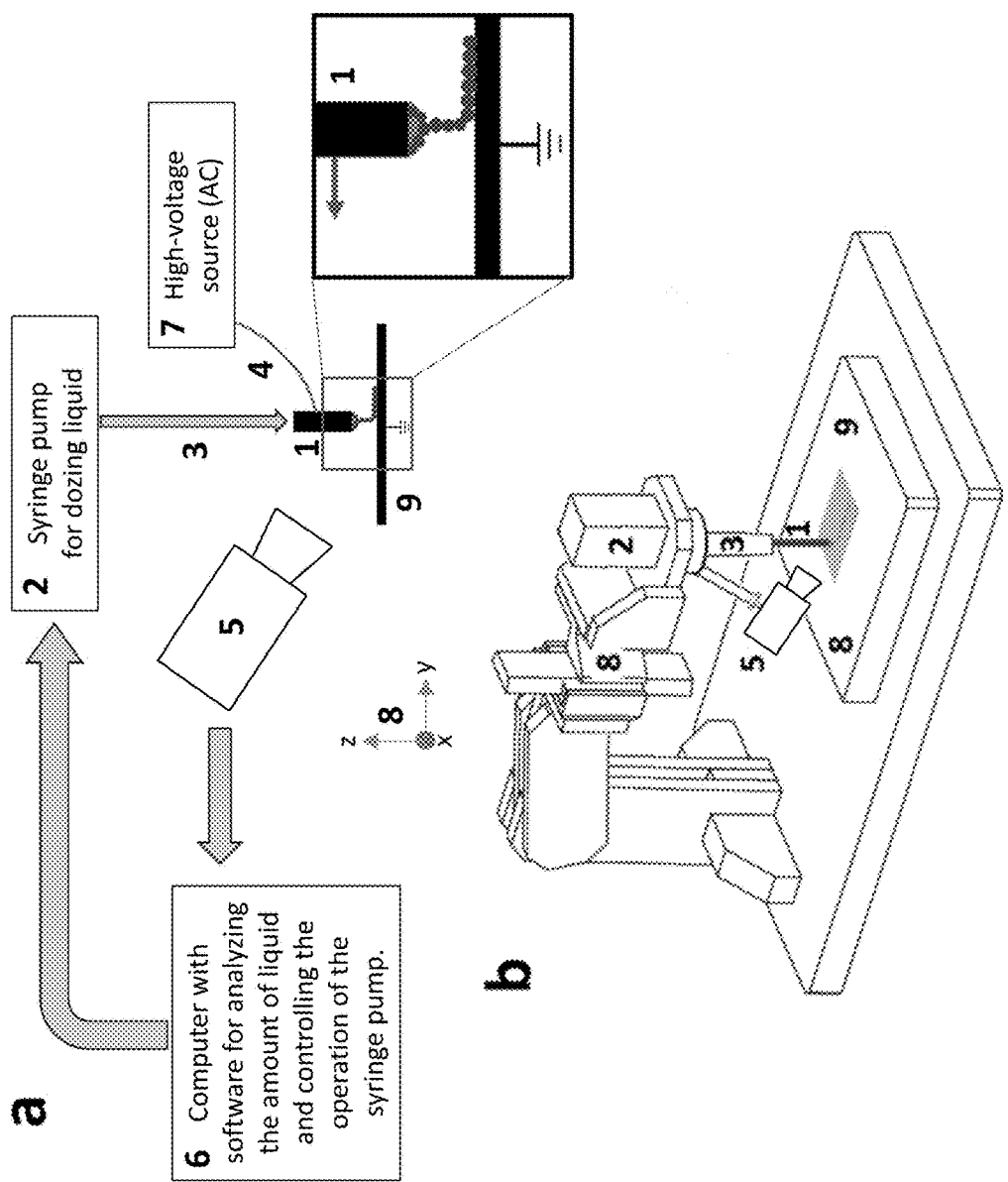
FIG. 18 (a-b) is a schematic diagram illustrating the system for fabricating beaded paths according to one embodiment (Example 18).

FIG. 18 is a schematic diagram illustrating an example of the embodiment of the second object of the invention, namely the system for fabricating a beaded path on the surface of a substrate. The system for fabricating a beaded path on the surface of a substrate 9 comprises a container for a liquid dispersion of particles, placed in a dispersion dosing unit 2. The unit 2 is fluid connected to the electrically conductive microcapillary 1 through a microfluidic unit 3, and the unit 2 contains a setup for controlling the amount of the dispersion that includes an optical system 5 connected with a computer 6. The setup for controlling the amount of the dispersion is connected to the dosing unit 2. Moreover, to the electrically conductive microcapillary 1 a source of high voltage 7 with a current limiter is connected through an electrical wire 4 and the translation stage.

The system operates as follows: A particle dispersion is conveyed to the conductive microcapillary 1, through the polymer tube 3 used in microfluidic units, from a dispersion container being here a syringe that is placed in a syringe pump 2. The inner diameter of the microcapillary 1 is at least five times the particle size to prevent microcapillary clogging by the flowing particles through that microcapillary. The length of the microcapillary is such that it enables connecting it with the electrical wire 4, which provides voltage. The length of the microcapillary 1 is at least ten times as large as the size of particles.

The method for connecting the electrical wire 4 is optional: it can be soldered, glued using a conductive adhesive, or mechanically mounted to the top part of the microcapillary 1. Herein, the electrically conductive microcapillaries were made of stainless steel. Such microcapillaries with different inner diameters and lengths that are suitable for the invention embodiment are available commercially.

To dose an appropriate amount of the dispersion, that is, to avoid the excess dispersion flowing out of the microcapillary 1, which could then drip on the substrate 9, and to ensure that the dispersion does not run short for the embodiment of the invention an optical system is used that comprises a digital microscope 5 connected to the computer 6 with software used for both analyzing the amount of the dispersion (i.e., the shape of the dispersion meniscus) and controlling the operation of the syringe pump.

If a need arises for the use of particles with a density lower than the density of the liquid, a solution can be employed in which the surface of the substrate 9 is placed above the microcapillary 1 with its outlet end pointing upwards, meaning that the beaded structure is formed in the opposite direction to the gravity direction and the particles initially placed in the dispersion forming the convex meniscus at the outlet end of the microcapillary 1 will be transported upwards towards the surface of the substrate 9. The distance between the dispersion meniscus and the surface of the substrate 9 is at least three times the particle size, but not smaller than 50 μm and not greater than fifty-fold the size of a particle.

Both the substrate 9 and the microcapillary 1 are moved using the translation stages 8 along the xyz axes during the process of fabricating a beaded path in a form of a line or a non-linear pattern on the surface of the substrate 9. The translation stage enables translation with the step not greater than the order of magnitude of particle size.

Example 19

In the present example, the same silicone oil and conductive particles were used for preparing the dispersion as in Example 1. The dispersion was supplied to the microcapillary in the same way as in Example 1. Nonconductive flexible 50 μm thick polymer foil (DuPont Teijin Films U.S. Limited Partnership, USA) placed on a conductive stainless-steel grounded stage was used as a substrate. Two experiments were conducted. In the first experiment, the substrate was covered with a layer of photosensitive polymer resin (FLGPCL04, Formlabs, USA) with a thickness of approximately 100 μm (FIG. 16 (c)), whereas in the second experiment the substrate was covered with a thinner layer of the same resin with a thickness of approximately 20 μm. The microcapillary was brought towards the surface of the liquid resin (approximately 200 μm), and then the fabrication of a beaded patch on the substrate was initiated. In the present example, square-wave voltage with a frequency of 1 kHz and the mean voltage value ($V_{rms}$) of 500 V was applied to form the beaded structure, and then 300 V was applied during the fabrication of the beaded path at an average speed of 0.5 mm/s. Images marked as (2) in FIG. 16 (c-d) demonstrate the process of fabricating the beaded path. In the first experiment, as well as in the second experiment, the resin was hardened by illuminating it with a UV light (time of exposure: 10 seconds, wavelength: 365 nm, irradiance: approximately 50 mW/cm$^2$, the light source was purchased from ThorLabs, USA, model: CS2010) after the beaded path was fabricated. In such a way, a flexible composite material was made (the first experiment), in which the particles were completely embedded in the resin that protected the path against mechanical damage, that is, the attempted damaging mechanically the path by moving the metal part of a screwdriver against the hardened resin was unsuccessful (images (3-4) in FIG. 16 (c)). Whereas, by hardening the thin layer of the resin (the second experiment, image (3) in FIG. 16 (d)) and then by mechanically removing particles from that layer of resin (scrapping with a sponge), a porous material was obtained, with pores formed in the places where the beaded paths were fabricated, and the size of the pores corresponded to the size of the particles (image (4) in FIG. 16 (d)).

The invention claimed is:

1. A process of fabricating a one-dimensional path of aligned one by one particles on the surface of a substrate, wherein
   a) a dispersion of electrically conductive particles in an electrically weakly-conductive liquid is prepared, and wherein the value of the dielectric constant of the particles is at least twice that of the dielectric constant of the dispersion liquid, whereas the value of the electrical conductivity of the particles is at least one order of magnitude larger than that of the dispersion liquid;
   b) the prepared dispersion is supplied in a continuous manner to at least one electrically conductive microcapillary positioned above and/or below the surface of a substrate;
   c) a convex meniscus of the dispersion is formed and maintained at an outlet end of the microcapillary;
   d) alternating voltage is provided to the microcapillary to pull a particle out from the dispersion meniscus, so that a structure of aligned one by one particles is formed between the dispersion meniscus and the surface of the substrate; and
   e) the microcapillary is moved relative to the substrate and/or the substrate relative to the microcapillary so that the particles of the formed structure of aligned one by one particles are deposited on the surface of the substrate and the one-dimensional structure of aligned one by one particles formed between the dispersion meniscus and the surface of the substrate is rebuilt simultaneously, so that a path of aligned one by one particles is fabricated on the surface of that substrate.

2. A process according to claim 1, wherein the particles are of solid matter or soft matter material.

3. A process according to claim 1, wherein the particles have a size of 20 nm to 1 mm.

4. A process according to claim 3, wherein the particles are granular.

5. A process according to claim 1, wherein the particles are made of an electrically conductive material and/or a material with a high dielectric constant or the core-shell particle type, where the core is electrically non-conductive and the shell is made of an electrically conductive material.

6. A process according to claim 5, wherein the particles are selected from the group consisting of i) steel particles, ii) glass particles coated with a layer of silver iii) modified polystyrene particles, and iv) copper particles.

7. A process according to claim 1, wherein the particles are spherical, oval, or cylindrical.

8. A process according to claim 1, wherein the particles are dispersed in a liquid of low dielectric constant having a viscosity in the range of 10 mPa·s to 10000 mPa·s or in a mixture of such liquids.

9. A process according to claim 8, wherein the particles are dispersed in a liquid selected from the group consisting of natural oil, synthetic oil, paraffin, and resin.

10. A process according to claim 1, wherein the concentration of particles in the dispersion is in the range of 10% to 50% by volume.

11. A process according to claim 1, wherein the distance between the dispersion meniscus and the surface of the substrate is at least three times the size of a single particle, and not less than 50 μm, and no more than fifty times the size of a single particle.

12. A process according to claim 1, wherein the alternating voltage is applied with a magnitude such that the dielectrophoretic force acting on the particle overcomes the capillary force resulting from a capillary bridge formed between the surface of the dispersion meniscus and the particle being pulled out from the dispersion meniscus.

13. A process according to claim 12, wherein the magnitude of the voltage applied to the microcapillary is at least 300 V, and the frequency of the voltage is at least 100 Hz.

14. A process according to claim 13, wherein a voltage used to initiate the formation of a structure of aligned one by one particles is approximately twice as high as the magnitude of the voltage used during the deposition of the particles of the formed structure of aligned one by one particles on the surface of a substrate.

15. A process according to claim 1, wherein a material with electrical conductivity below 103 S·m−1 or a material with electrical conductivity above 103 S·m−1 coated with a layer of a material with electrical conductivity below 103 S·m−1 is used as the substrate.

16. A process according to claim 1, wherein the structure of aligned one by one particles is deposited on the surface of a substrate partially or completely covered with a liquid immiscible with the dispersion liquid.

17. A process according to claim 1, wherein a path of aligned one by one particles in a form of a line or a non-linear pattern is fabricated.

18. A process according to claim 17, wherein one or more additional paths of aligned one by one particles are fabricated to cross or connect with the line or the non-linear pattern on the surface of a substrate.

19. A process according to claim 1, wherein the meniscus at stage c) of the process is made and maintained by means of a setup for controlling the amount of the dispersion supplied from a dosing unit to the microcapillary.

20. A process according to claim 1, wherein a voltage generator with the possibility of adjusting the electric current, or a voltage generator with an external current limiter, is used as a source of the alternating voltage.

* * * * *